US010802101B2

(12) United States Patent
Chang

(10) Patent No.: US 10,802,101 B2
(45) Date of Patent: Oct. 13, 2020

(54) METHOD AND SYSTEMS FOR COIL SELECTION IN MAGNETIC RESONANCE IMAGING TO REDUCE PHASE WRAP ARTIFACT

(71) Applicant: General Electric Company, Schenectady, NY (US)

(72) Inventor: Shaorong Chang, Hartland, WI (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 252 days.

(21) Appl. No.: 15/995,023

(22) Filed: May 31, 2018

(65) Prior Publication Data
US 2019/0369198 A1    Dec. 5, 2019

(51) Int. Cl.
*G01R 33/565* (2006.01)
*G01R 33/28* (2006.01)
*G01R 33/58* (2006.01)
*G01R 33/483* (2006.01)

(52) U.S. Cl.
CPC ..... *G01R 33/56545* (2013.01); *G01R 33/283* (2013.01); *G01R 33/4833* (2013.01); *G01R 33/583* (2013.01)

(58) Field of Classification Search
CPC ................ G01R 33/283; G01R 33/583; G01R 33/4833; G01R 33/56545
See application file for complete search history.

(56) References Cited

U.S. PATENT DOCUMENTS 6,717,406 B2    4/2004 Sodickson
6,961,455 B2    11/2005 Ma et al.
(Continued)

FOREIGN PATENT DOCUMENTS

EP    2255214 B1    5/2017
WO    2009112987 A1    9/2009
(Continued)

OTHER PUBLICATIONS

Chang, S. et al., "Methods and Systems for Coil Selection in Magnetic Resonance Imaging," U.S. Appl. No. 15/995,012, filed May 31, 2018, 50 pages.
(Continued)

*Primary Examiner* — Dixomara Vargas
(74) *Attorney, Agent, or Firm* — McCoy Russell LLP

(57) ABSTRACT

Various methods and systems are provided for a radio frequency coil array comprising a plurality of coil elements for magnetic resonance imaging. In one embodiment, a method includes grouping the plurality of coil elements into receive elements groups (REGs) according to REGs information, generating coil element sensitivity maps for the plurality of coil elements, generating REG sensitivity maps based on the REGs information and the coil element sensitivity maps, determining, for each REG, signals within a region of interest (ROI) and signals outside of the ROI based on the REG sensitivity maps, selecting one or more REGs based on the signals within the ROI and the signals outside of the ROI of each REG, and scanning the ROI with the coil elements in the selected REGs being activated and the coil elements not in any selected REGs being deactivated. In this way, phase wrap artifacts may be reduced.

19 Claims, 12 Drawing Sheets

(56) References Cited

U.S. PATENT DOCUMENTS

| | | | |
|---|---|---|---|
| 7,800,368 B2* | 9/2010 | Vaughan | G01R 33/5612 324/318 |
| 7,924,007 B2 | 4/2011 | Arnold et al. | |
| 8,188,738 B2* | 5/2012 | Hori | G01R 33/5611 324/318 |
| 8,488,860 B2* | 7/2013 | Uchizono | G01R 33/561 382/131 |
| 8,502,535 B2 | 8/2013 | Jurrissen et al. | |
| 8,934,694 B2 | 1/2015 | Chen et al. | |
| 9,084,553 B2 | 7/2015 | Warmuth | |
| 9,395,431 B2 | 7/2016 | Detsky et al. | |
| 9,427,171 B2 | 8/2016 | Gdaniec et al. | |
| 9,655,522 B2 | 5/2017 | Li et al. | |
| 9,675,249 B2 | 6/2017 | Miyazaki et al. | |
| 9,678,189 B2 | 6/2017 | Mekkaoui | |
| 9,700,220 B2 | 7/2017 | Miyazaki et al. | |
| 9,760,979 B2 | 9/2017 | Chen et al. | |
| 9,835,705 B2 | 12/2017 | Weingartner et al. | |
| 9,846,215 B2 | 12/2017 | Hamada et al. | |
| 9,846,217 B2 | 12/2017 | Lin | |
| 9,874,620 B2 | 1/2018 | Ahmad et al. | |
| 9,886,745 B2 | 2/2018 | Chen et al. | |
| 2003/0132750 A1* | 7/2003 | Machida | G01R 33/3415 324/322 |
| 2005/0275402 A1 | 12/2005 | Campagna | |
| 2006/0087320 A1* | 4/2006 | Machida | G01R 33/3415 324/322 |
| 2006/0197633 A1* | 9/2006 | Lee | G01R 33/34046 333/231 |
| 2007/0013375 A1* | 1/2007 | Akao | G01R 33/5611 324/309 |
| 2007/0164742 A1* | 7/2007 | Bito | G01R 33/34046 324/318 |
| 2007/0210793 A1 | 9/2007 | Kiefer | |
| 2008/0129298 A1* | 6/2008 | Vaughan | G01R 33/5612 324/322 |
| 2008/0211502 A1 | 9/2008 | Arnold et al. | |
| 2008/0290870 A1 | 11/2008 | Misic | |
| 2011/0006766 A1 | 1/2011 | Jurrissen et al. | |
| 2011/0103668 A1* | 5/2011 | Uchizono | G01R 33/561 382/131 |
| 2014/0002083 A1 | 1/2014 | Asaba et al. | |
| 2014/0145717 A1 | 5/2014 | Ozawa et al. | |
| 2014/0300355 A1 | 10/2014 | Fautz et al. | |
| 2015/0247911 A1 | 9/2015 | Iwadate | |
| 2015/0355303 A1* | 12/2015 | Kuhara | G01R 33/5611 324/322 |
| 2016/0018489 A1* | 1/2016 | Farivar-Mohseni | G01R 33/34084 600/422 |
| 2016/0198970 A1 | 7/2016 | Liu et al. | |
| 2016/0324427 A1 | 11/2016 | Meyer et al. | |
| 2017/0049355 A1 | 2/2017 | Furudate | |
| 2017/0089993 A1 | 3/2017 | McKinnon et al. | |
| 2017/0273578 A1 | 9/2017 | Finn et al. | |
| 2017/0328970 A1 | 11/2017 | Bi et al. | |
| 2017/0350953 A1 | 12/2017 | Huang et al. | |
| 2018/0059195 A1 | 3/2018 | Lai et al. | |
| 2019/0369179 A1* | 12/2019 | Chang | G01R 33/443 |
| 2019/0369180 A1* | 12/2019 | Chang | G01R 33/0005 |
| 2019/0369181 A1* | 12/2019 | Chang | G01R 33/58 |
| 2019/0369198 A1* | 12/2019 | Chang | G01R 33/3664 |

FOREIGN PATENT DOCUMENTS

| | | |
|---|---|---|
| WO | 2009112987 A8 | 9/2009 |
| WO | 2014084259 A1 | 6/2014 |

OTHER PUBLICATIONS

Chang, S. et al., "Method and Systems for Coil Selection in Magnetic Resonance Imaging," U.S. Appl. No. 15/995,051, filed May 31, 2018, 67 pages.

Chang, S. et al., "Method and Systems for Coil Selection in Magnetic Resonance Imaging to Reduce Annefact Artifact," U.S. Appl. No. 15/995,059, filed May 31, 2018, 54 pages.

United States Patent and Trademark Office, Office Action Issued in U.S. Appl. No. 15/995,059, dated Mar. 30, 2020, 17 pages.

* cited by examiner

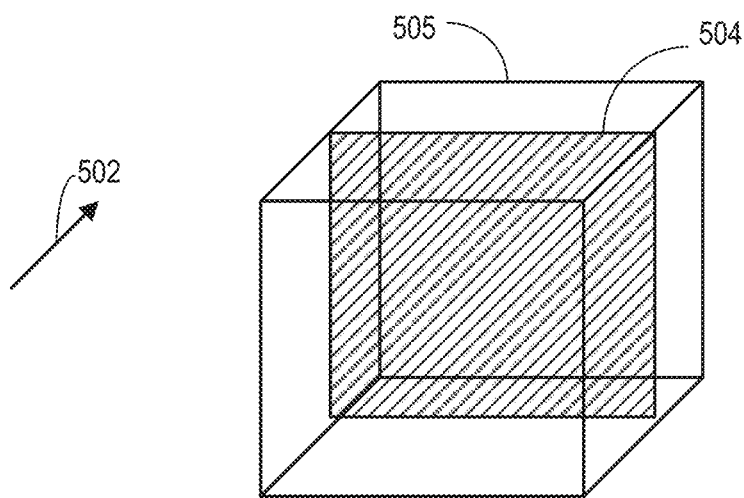
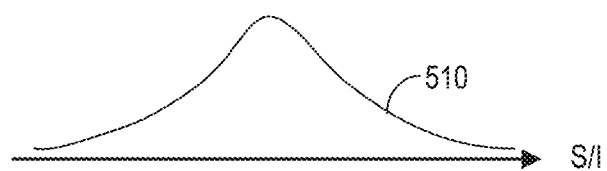
FIG. 5
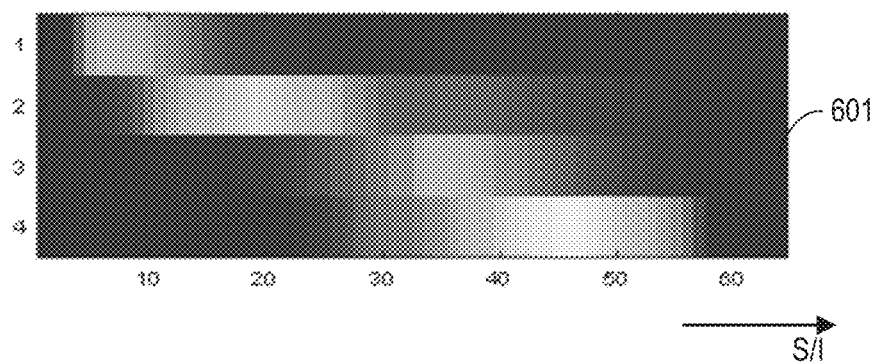
FIG. 6

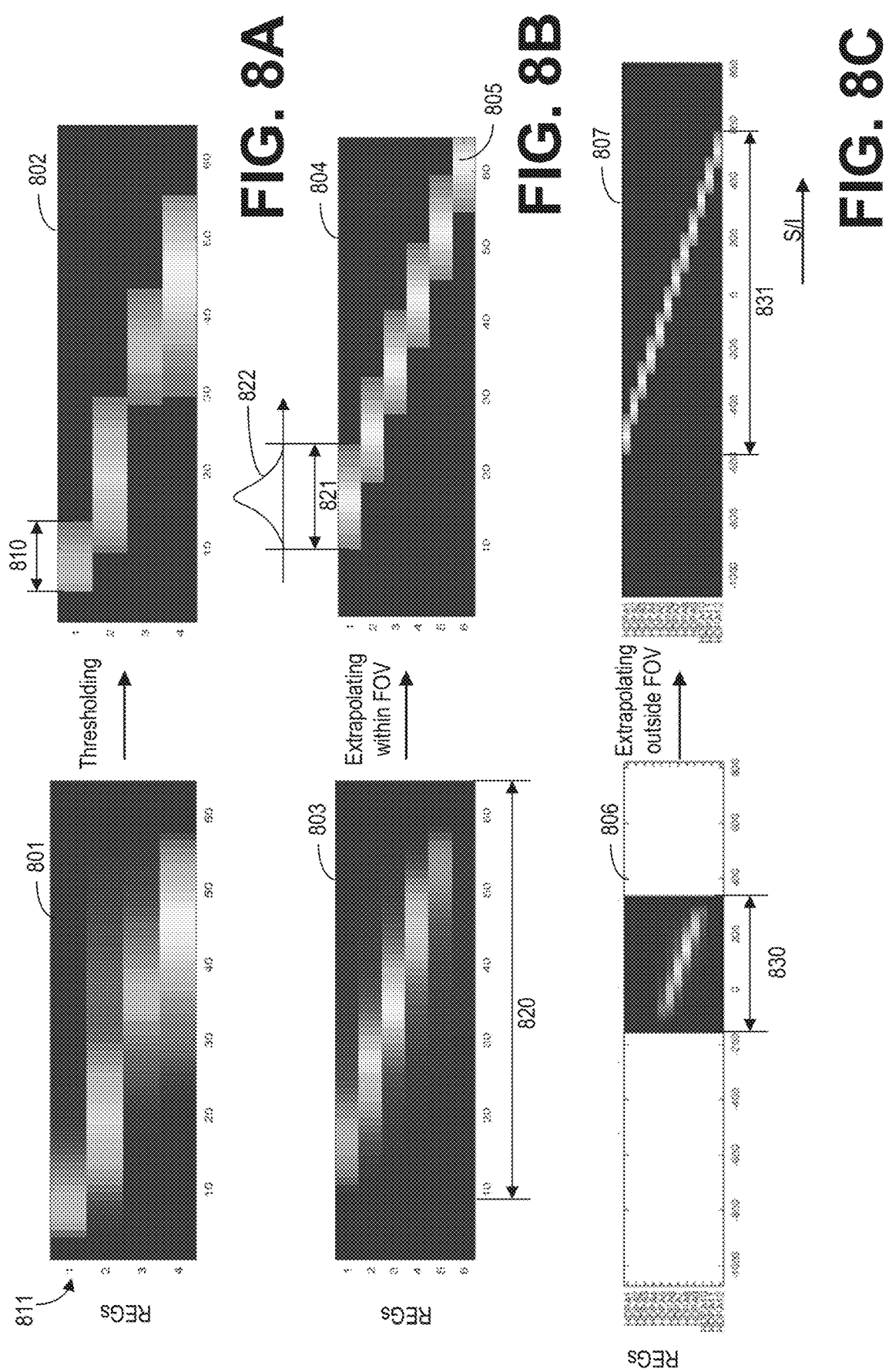

METHOD AND SYSTEMS FOR COIL SELECTION IN MAGNETIC RESONANCE IMAGING TO REDUCE PHASE WRAP ARTIFACT

FIELD

Embodiments of the subject matter disclosed herein relate to magnetic resonance imaging, and more particularly, to selecting radio-frequency (RF) coil arrays to reduce the phase wrap artifact during magnetic resonance imaging.

BACKGROUND

Magnetic resonance imaging (MRI) is a medical imaging modality that can create images of the inside of a human body without using x-rays or other ionizing radiation. MRI uses a powerful magnet to create a strong, uniform, static magnetic field $B_0$. When the human body, or part of the human body, is placed in the magnetic field $B_0$, the nuclear spins associated with the hydrogen nuclei in tissue water become polarized, wherein the magnetic moments associated with these spins become preferentially aligned along the direction of the magnetic field $B_0$, resulting in a small net tissue magnetization along that axis. MRI systems also include gradient coils that produce smaller amplitude, spatially-varying magnetic fields with orthogonal axes to spatially encode the magnetic resonance (MR) signal by creating a signature resonance frequency at each location in the body. The hydrogen nuclei are excited by a radio frequency signal at or near the resonance frequency of the hydrogen nuclei, which add energy to the nuclear spin system. As the nuclear spins relax back to their rest energy state, they release the absorbed energy in the form of an RF signal. This RF signal (or MR signal) is detected by one or more RF coil arrays and is transformed into the image using a computer and known reconstruction algorithms.

In some examples, one or more of the RF coil arrays may be removable. For example, based on a given imaging objective, the operator can position a selected surface RF coil array over the imaging subject and plug the RF coil array into the MRI imaging apparatus. Further, some RF coil arrays may be deformable, stretchable, or otherwise may have varying shapes or positions relative to the imaging subject.

BRIEF DESCRIPTION

In one embodiment, a method for magnetic resonance imaging (MRI) with a receive radio frequency (RF) coil array including a plurality of coil elements includes grouping the plurality of coil elements into receive elements groups (REGs) according to REGs information, generating coil element sensitivity maps for the plurality of coil elements, generating REG sensitivity maps based on the REGs information and the coil element sensitivity maps; determining, for each REG, signal within a region of interest (ROI) and signal outside of the ROI based on the REG sensitivity map, selecting one or more REGs based on the signal within the ROI and the signal outside of the ROI of each REG, and scanning the ROI with the coil elements in the selected REGs being activated and the coil elements not in any selected REGs being deactivated. In this way, the phase wrap artifact may be reduced in a reconstructed image of the ROI.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below:

FIG. 5 illustrates an example a coil element sensitivity map generated based on the calibration data.

FIG. 6 shows an example of raw REG sensitivity maps.

FIGS. 8A-8C show examples for processing raw REG sensitivity maps.

DETAILED DESCRIPTION

Figure 1:
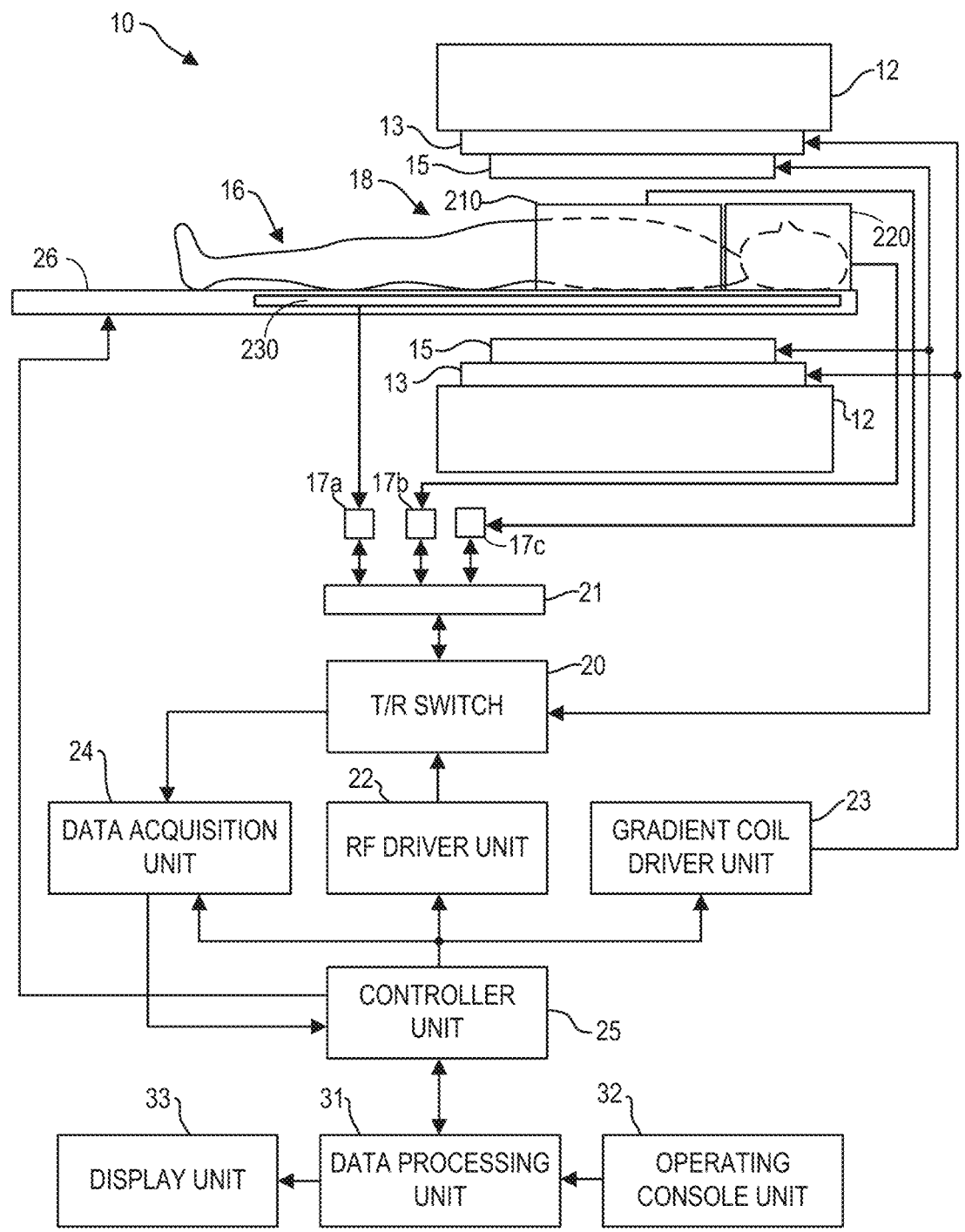
FIG. 1 is a block diagram of an MRI system according to an embodiment.
Figure 2:
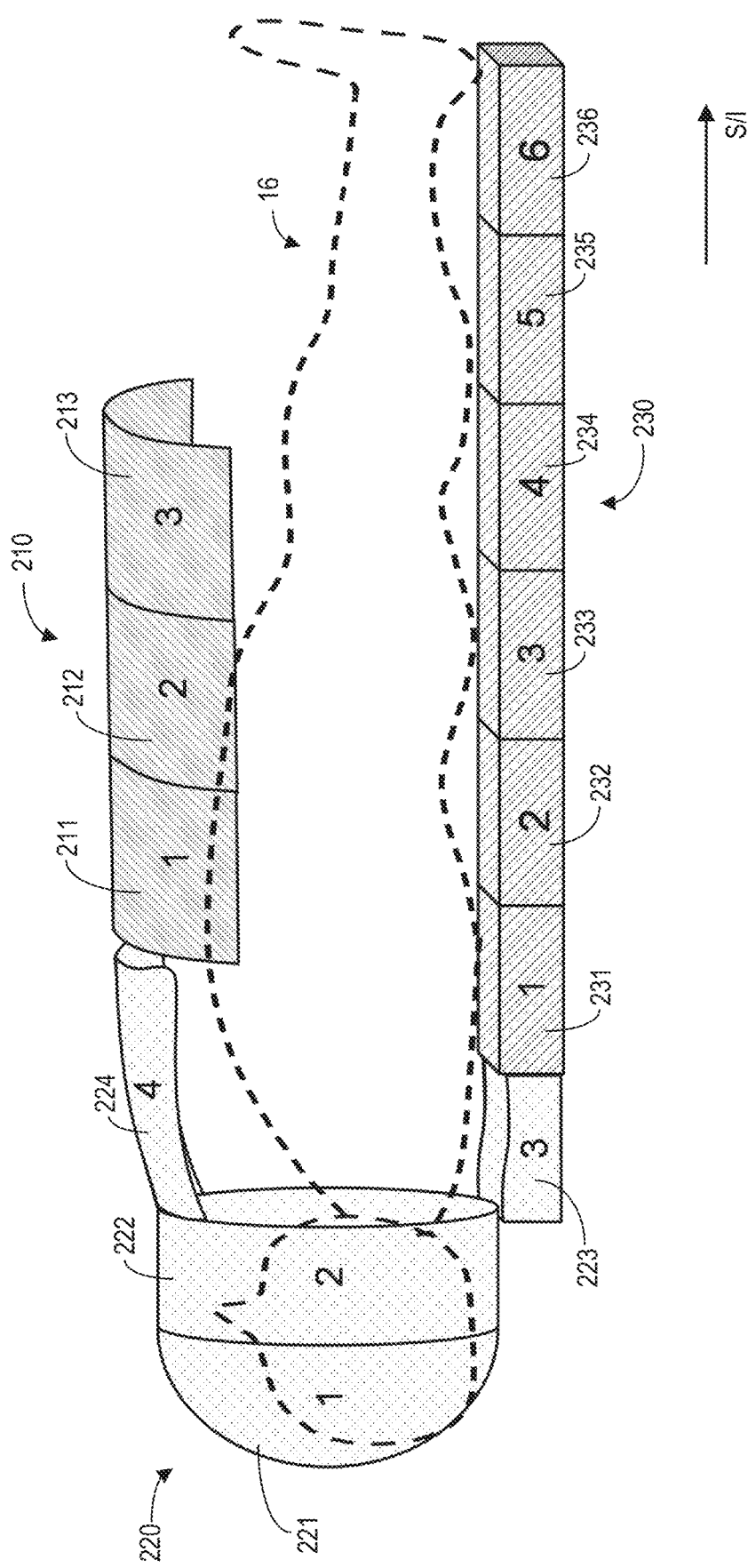
FIG. 2 is an example arrangement of RF coil arrays relative to an imaging subject.

The following description relates to various embodiments of selecting coil elements of one or more radio frequency (RF) coil arrays for receiving magnetic resonance (MR) signals in a magnetic resonance imaging (MRI) system, such as the MRI system depicted in FIG. 1. As shown in FIG. 2, a plurality of RF coil arrays may be arranged around a patient's body. Each of the RF coil arrays may include one or more coil elements. Each coil element is electronically coupled to the MRI apparatus, and may individually receive MR signals generated from different spatial locations. The coil elements may be grouped into a plurality of receive element groups (REGs) based on predetermined coil element grouping information.

Figure 9B:
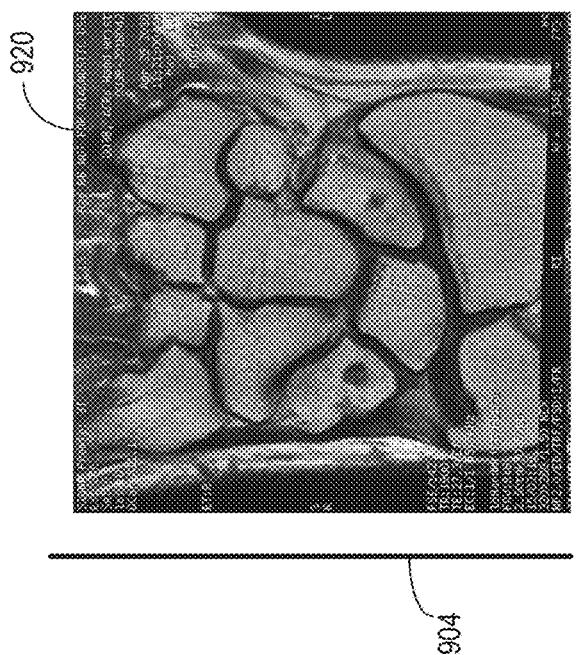
FIG. 9B shows an example image without the phase wrap artifact.
Figure 9A:
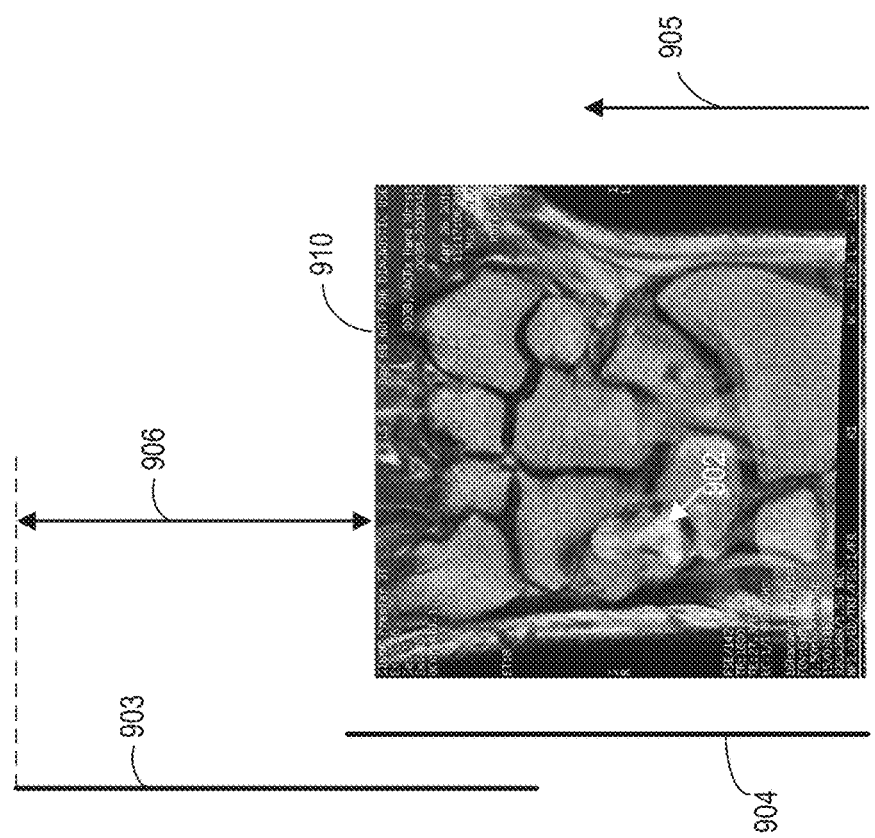
FIG. 9A shows an example image with the phase wrap artifact.

During MRI imaging, there is a tradeoff between the imaging field of view (FOV) and the signal acquisition time. A larger FOV requires denser sampling in the k-space, which increases the scan time. To reduce the scan time, a smaller FOV is scanned. Under certain conditions, a small FOV can meet the imaging objective. For example, when imaging a hand or an ankle, a region of interest (ROI) prescribed by the operator is relatively small and thus an entirety of the hand or ankle may be imaged even with a small FOV. However, the local receive RF coil arrays may not only receive MR signals generated from within the FOV, but also the MR signals generated outside of the FOV. As an example, if a part of the subject is located right outside of the FOV, the RF coil array may pick up MR signals generated from the subject outside of the FOV. The signals generated outside of the FOV may introduce a phase wrap artifact, wherein the part of the subject outside the FOV folds over into the part of the subject within the ROI. The phase wrap artifact is likely to occur when the FOV is small, wherein part of the subject is more likely to be present right outside of the FOV. Further, the phase wrap artifact is likely to happen in the phase encoding direction. In one example, as shown in FIGS. 9A-9B, when imaging a wrist with a hand/wrist coil array, fingers may appear in the reconstructed wrist image.

One approach to avoid the phase wrap artifact in MRI with a small ROI or FOV is to increase the FOV during the scan by increasing the sampling density, and only display the image within the ROI. However, such an approach increases the scan time. In contrast, the disclosure can reduce the phase wrap artifact by using only selected REGs of the RF coil array for receiving the MR signals to reduce the sensitivity region without increasing the scan time.

According to embodiments disclosed herein, one or more of the REGs may be selected to receive MR signals when scanning the FOV. In particular, for each REG, the amount of MR signals generated outside of the ROI received by the REG is evaluated based on data acquired from a calibration scan. A REG that receives a large amount of MR signals generated outside of the ROI may contribute more to the phase wrap artifact while a REG that receives a small amount (or none) of MR signals generated outside the ROI may contribute less to the phase wrap artifact. Thus, one or more REGs for the main scan may be selected based on the MR signals generated outside of the ROI relative to the MR signals generated inside the ROI. For example, a REG that has a higher total sensitivity to MR signals generated inside the ROI than total sensitivity to MR signals generated outside the ROI may be selected for the main scan. The selected REGs are then used for receiving MR signals during the main scan. In this way, phase wrap artifact in the image reconstructed from data acquired in the main scan may be reduced or avoided.

Figure 3:
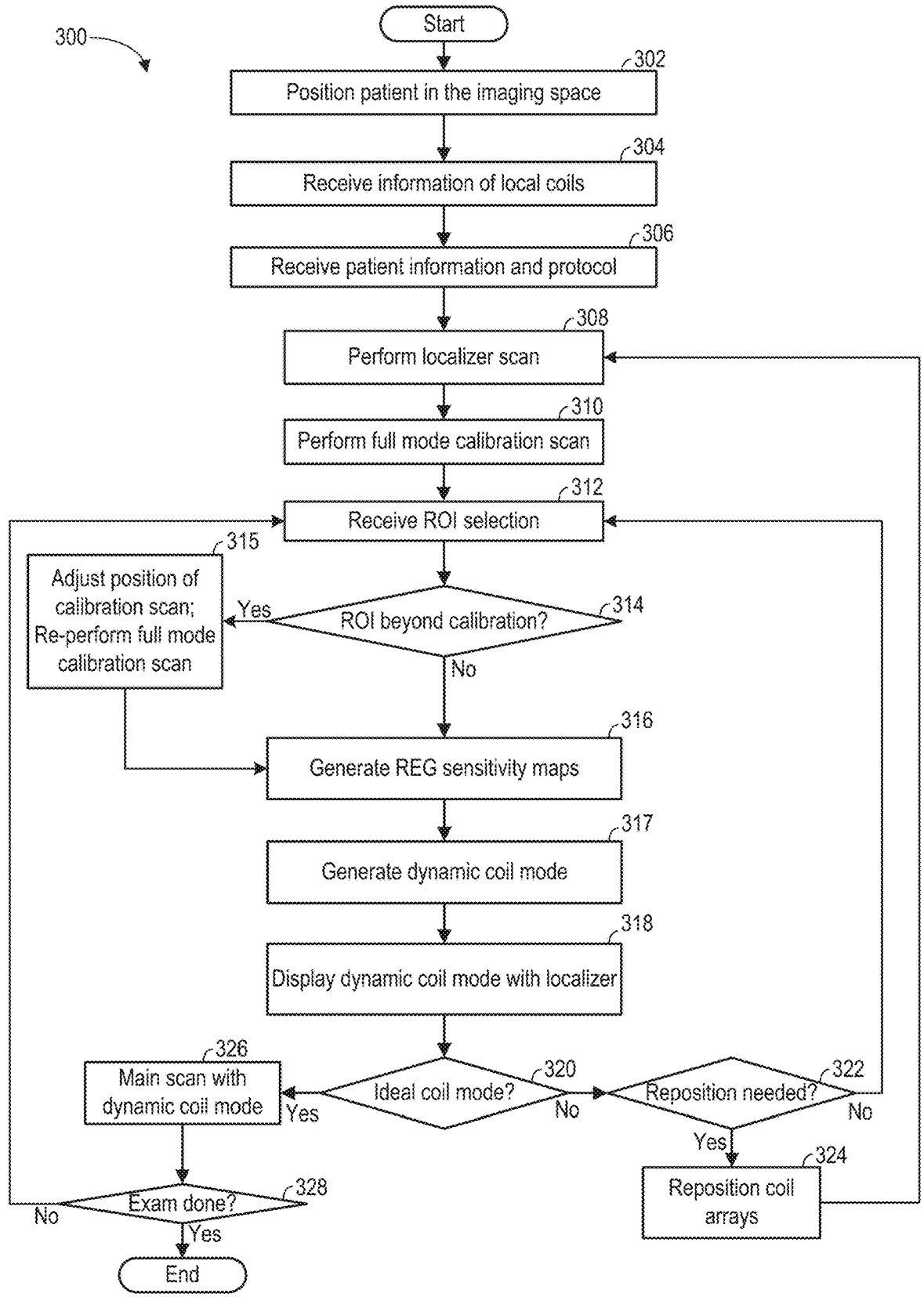
FIG. 3 is a high-level flow chart illustrating an example method for selecting RF coil arrays during MRI scan to reduce a phase wrap artifact.
Figure 10:
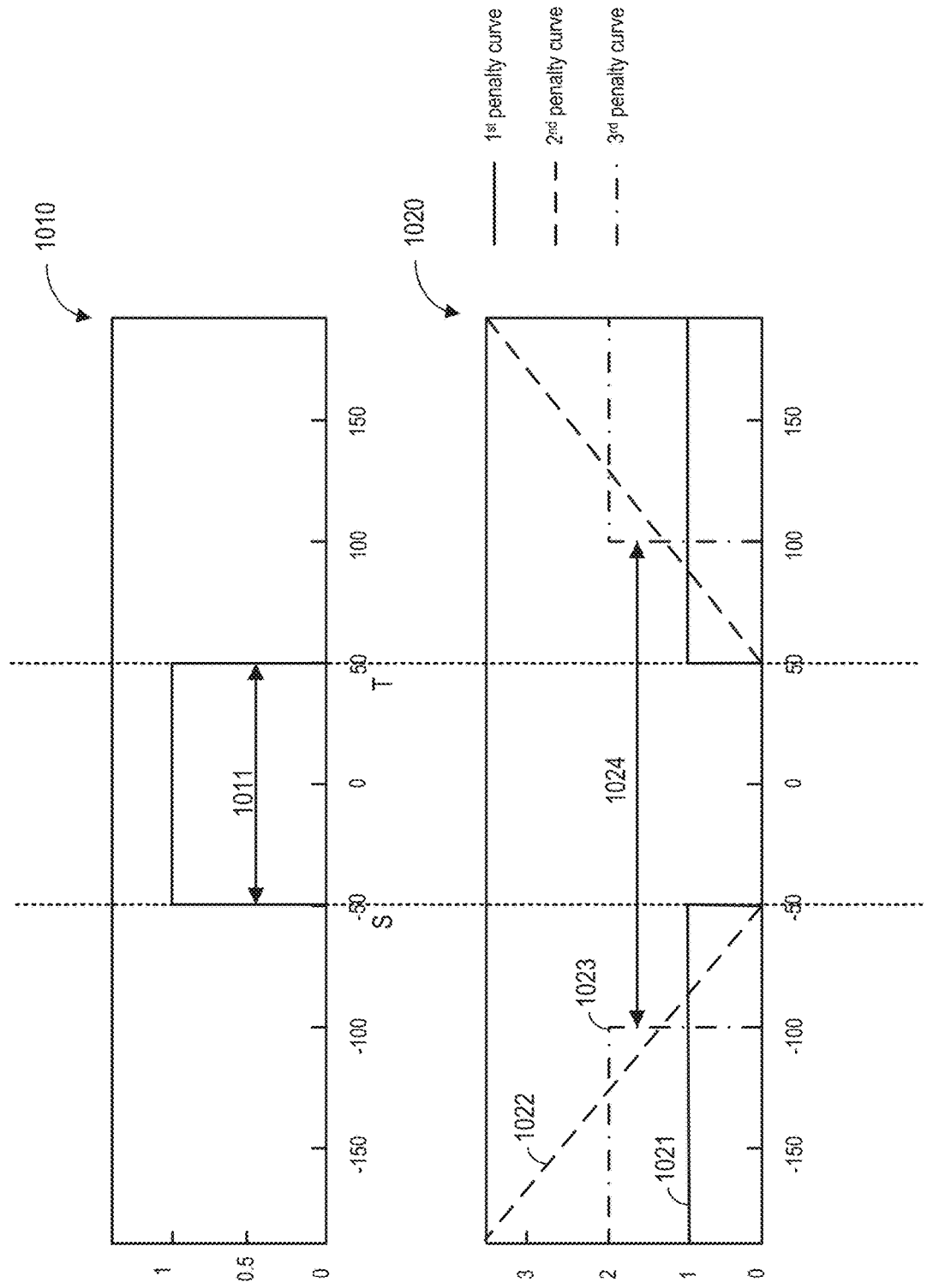
FIG. 10 shows examples of penalty curves and the corresponding ROI profile.
Figure 11:
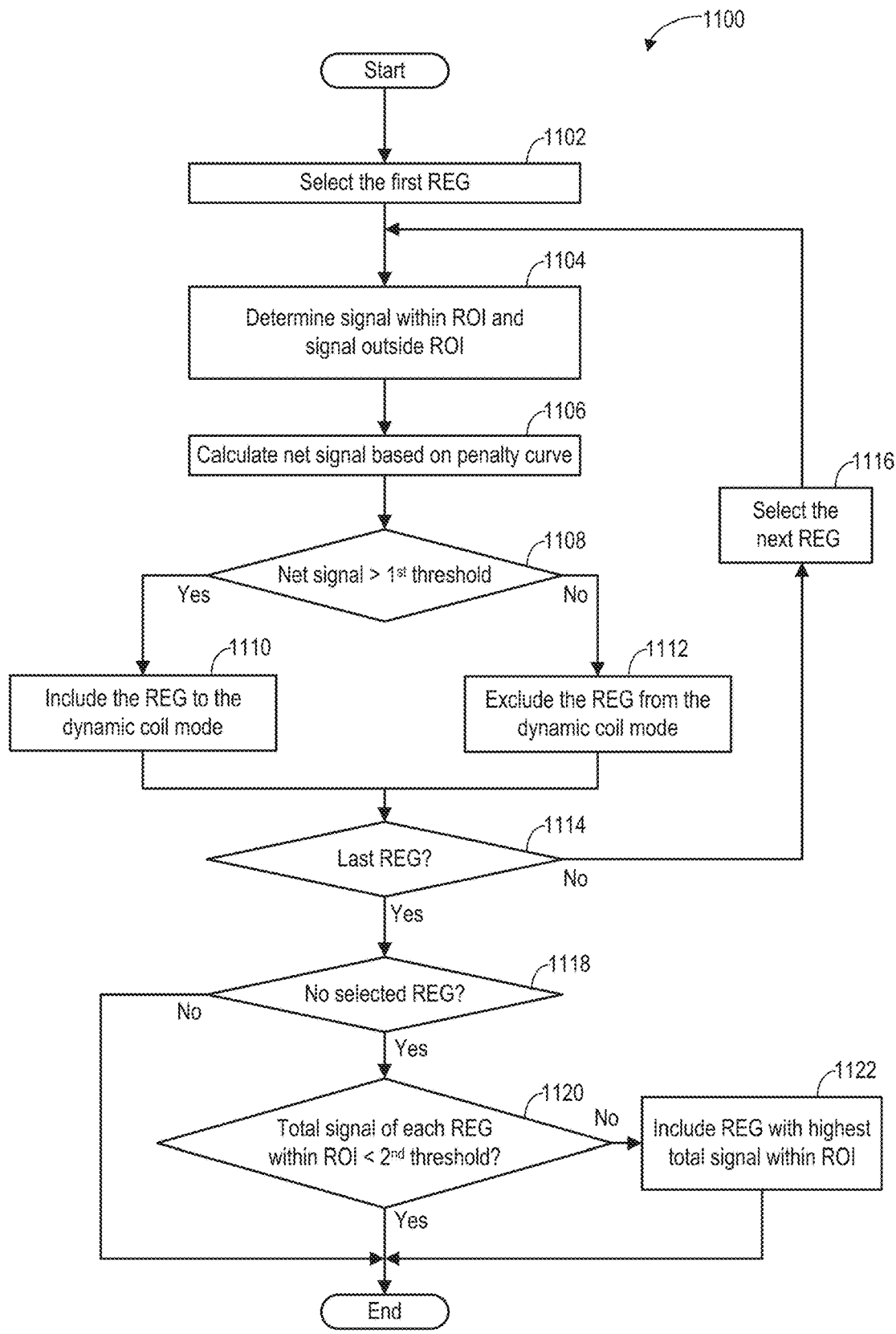
FIG. 11 is a flow chart of an example subroutine for determining a dynamic coil mode.
Figure 12A:
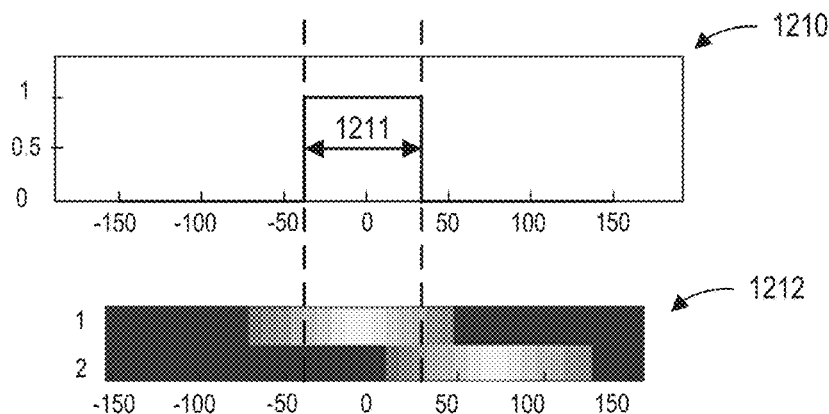
FIGS. 12A-12C show examples of dynamic coil modes determined based on different ROI profiles.
Figure 12B:
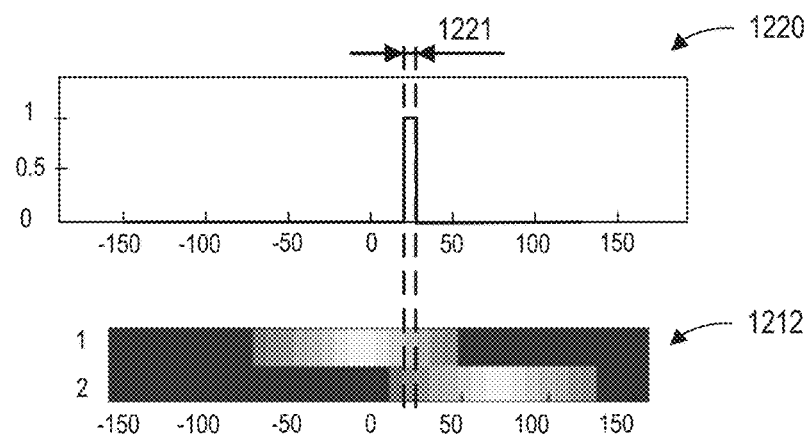
Figure 12C:
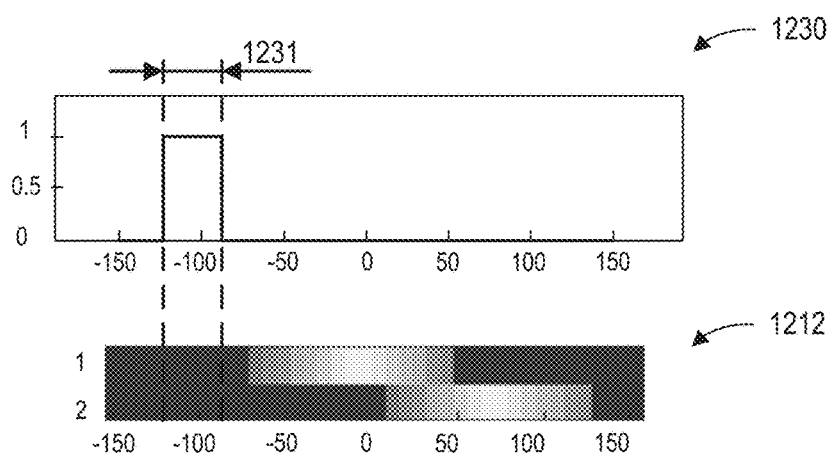
Figure 13:
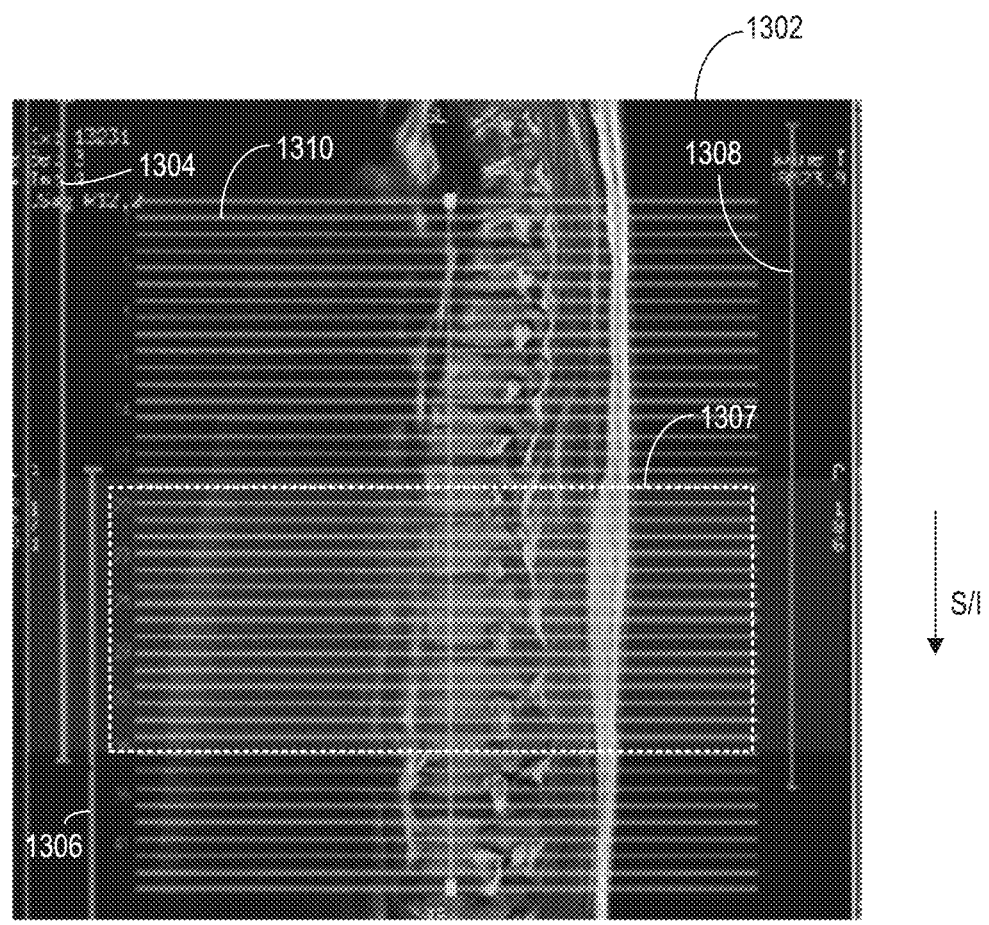
FIG. 13 is an example visual representation of a dynamic coil mode with an MRI image.

As shown in FIG. 3, during the MRI scan, MR signals received from selected REGs are reconstructed to form an image of the imaging subject. The REGs are selected based on data acquired from a lower resolution calibration scan. Based on the acquired data, REG sensitivity maps may be determined according to subroutine of FIG. 4. During the subroutine of FIG. 4, a coil element sensitivity of each coil element may be generated from a 3D dataset acquired via the coil element, as shown in FIG. 5. Raw REG sensitivity maps are generated by combining the coil element sensitivities of the coil elements belonging to each of the REGs. FIG. 6 shows example raw REG sensitivity maps. Based on the type of the coil array, REG sensitivity maps may be generated from the raw REG sensitivity maps according to the subroutine of FIG. 7. FIGS. 8A-8C show examples for processing raw REG sensitivity maps to obtain the REG sensitivity maps. FIG. 9A shows an example image of a wrist with a phase wrap artifact. FIG. 9B shows an example image of the wrist without the phase wrap artifact. FIG. 10 shows examples of the penalty curves for calculating a net signal. FIG. 11 shows an example subroutine for calculating the net signal, and determining the dynamic coil mode based on the net signal. FIGS. 12A-12C show examples of dynamic coil modes determined based on the ROI. The dynamic coil mode may be displayed to the operator as shown in FIG. 13.

FIG. 1 illustrates a magnetic resonance imaging (MRI) apparatus 10 that includes a magnetostatic field magnet unit 12, a gradient coil unit 13, one or more local RF coil arrays (210, 220, and 230), an RF body coil unit 15, a transmit/receive (T/R) switch 20, an RF port interface 21, an RF driver unit 22, a gradient coil driver unit 23, a data acquisition unit 24, a controller unit 25, a patient bed 26, a data processing unit 31, an operating console unit 32, and a display unit 33. The MRI apparatus 10 transmits electromagnetic pulse signals to a subject 16 placed in an imaging space 18 with a magnetostatic field formed to perform a scan for obtaining magnetic resonance (MR) signals from the subject 16 to reconstruct an image of the slice of the subject 16 based on the MR signals thus obtained by the scan.

The magnetostatic field magnet unit 12 includes, for example, typically an annular superconducting magnet, which is mounted within a toroidal vacuum vessel. The magnet defines a cylindrical space surrounding the subject 16, and generates a constant primary magnetostatic field $B_0$.

The MRI apparatus 10 also includes a gradient coil unit 13 that forms a gradient magnetic field in the imaging space 18 so as to provide the magnetic resonance signals received by the RF coil arrays with three-dimensional positional information. The gradient coil unit 13 includes three gradient coil systems, each of which generates a gradient magnetic field which inclines into one of three spatial axes perpendicular to each other, and generates a gradient field in each of frequency encoding direction, phase encoding direction, and slice selection direction in accordance with the imaging condition. More specifically, the gradient coil unit 13 applies a gradient field in the slice selection direction (or scan direction) of the subject 16, to select the slice; and the RF body coil unit 15 or the local RF coil arrays may transmit an RF pulse to a selected slice of the subject 16. The gradient coil unit 13 also applies a gradient field in the phase encoding direction of the subject 16 to phase encode the magnetic resonance signals from the slice excited by the RF pulse. The gradient coil unit 13 then applies a gradient field in the frequency encoding direction of the subject 16 to frequency encode the magnetic resonance signals from the slice excited by the RF pulse.

Three local RF coil arrays 210, 220, and 230 are shown herein. The local RF coil arrays are disposed, for example, to enclose the region to be imaged of the subject 16. In the static magnetic field space or imaging space 18 where a static magnetic field $B_0$ is formed by the magnetostatic field magnet unit 12, the local RF coil arrays may transmit, based on a control signal from the controller unit 25, an RF pulse that is an electromagnet wave to the subject 16 and thereby generates a high-frequency magnetic field $B_1$. This excites a spin of protons in the slice to be imaged of the subject 16. The local RF coil arrays receive, as a MR signal, the electromagnetic wave generated when the proton spin returns into alignment with the initial magnetization vector. In one embodiment, the local RF coil may transmit and receive an RF pulse using the same local RF coil. In another embodiment, the local RF coil may be used for only receiving the MR signals, but not transmitting the RF pulse. Details of the local RF coil arrays are presented in FIG. 2.

The RF body coil unit 15 is disposed, for example, to enclose the imaging space 18, and produces RF magnetic field pulses $B_1$ orthogonal to the main magnetic field $B_0$ produced by the magnetostatic field magnet unit 12 within the imaging space 18 to excite the nuclei. In contrast to the local RF coil arrays (such as local RF coil arrays 210 and 220), which may be easily disconnected from the MRI apparatus 10 and replaced with another local RF coil, the RF body coil unit 15 is fixedly attached and connected to the MRI apparatus 10. Furthermore, whereas coil arrays can transmit to or receive signals from only a localized region of the subject 16, the RF body coil unit 15 generally has a larger coverage area and can be used to transmit or receive signals to the whole body of the subject 16. Using receive-only RF coil arrays and transmit body coils provides a uniform RF excitation and good image uniformity at the expense of high RF power deposited in the subject. For a transmit-receive RF coil array, the coil array provides the RF excitation to the region of interest and receives the MR signal, thereby decreasing the RF power deposited in the subject. It should be appreciated that the particular use of the local RF coil arrays and/or the RF body coil unit 15 depends on the imaging application.

The T/R switch 20 can selectively electrically connect the RF body coil unit 15 to the data acquisition unit 24 when operating in receive mode, and to the RF driver unit 22 when operating in transmit mode. Similarly, the T/R switch 20 can selectively electrically connect one or more of the local RF coil arrays to the data acquisition unit 24 when the local RF coil arrays operate in receive mode, and to the RF driver unit 22 when operating in transmit mode. When the local RF coil arrays and the RF body coil unit 15 are both used in a single scan, for example if the local RF coil arrays are configured to receive MR signals and the RF body coil unit 15 is configured to transmit RF signals, then the T/R switch 20 may direct control signals from the RF driver unit 22 to the RF body coil unit 15 while directing received MR signals from the local RF coil arrays to the data acquisition unit 24. The RF body coil unit 15 may be configured to operate in a transmit-only mode, a receive-only mode, or a transmit-receive mode. The local RF coil arrays may be configured to operate in a transmit-receive mode or a receive-only mode.

The RF driver unit 22 includes a gate modulator (not shown), an RF power amplifier (not shown), and an RF oscillator (not shown) that are used to drive the RF coil arrays and form a high-frequency magnetic field in the imaging space 18. The RF driver unit 22 modulates, based on a control signal from the controller unit 25 and using the gate modulator, the RF signal received from the RF oscillator into a signal of predetermined timing having a predetermined envelope. The RF signal modulated by the gate modulator is amplified by the RF power amplifier and then output to the RF coil arrays.

The gradient coil driver unit 23 drives the gradient coil unit 13 based on a control signal from the controller unit 25 and thereby generates a gradient magnetic field in the imaging space 18. The gradient coil driver unit 23 includes three systems of driver circuits (not shown) corresponding to the three gradient coil systems included in the gradient coil unit 13.

The data acquisition unit 24 includes a preamplifier (not shown), a phase detector (not shown), and an analog/digital converter (not shown) used to acquire the MR signals received by the local RF coil arrays. In the data acquisition unit 24, the phase detector phase detects, using the output from the RF oscillator of the RF driver unit 22 as a reference signal, the MR signals received from the RF coil arrays and amplified by the preamplifier, and outputs the phase-detected analog magnetic resonance signals to the analog/digital converter for conversion into digital signals. The digital signals thus obtained are output to the data processing unit 31.

The MRI apparatus 10 includes a table 26 for placing the subject 16 thereon. The subject 16 may be moved inside and outside the imaging space 18 by moving the table 26 based on control signals from the controller unit 25. One or more of the RF coil arrays may be coupled to the table 26 and moved together with the table.

The controller unit 25 includes a computer and a recording medium on which a program to be executed by the computer is recorded, in some embodiments. The program when executed by the computer causes various parts of the apparatus to carry out operations corresponding to predetermined scanning. The recording medium may comprise, for example, a ROM, flexible disk, hard disk, optical disk, magneto-optical disk, CD-ROM, or non-volatile memory card. The controller unit 25 is connected to the operating console unit 32 and processes the operation signals input to the operating console unit 32 and furthermore controls the table 26, RF driver unit 22, gradient coil driver unit 23, and data acquisition unit 24 by outputting control signals to them. The controller unit 25 also controls, to obtain a desired image, the data processing unit 31 and the display unit 33 based on operation signals received from the operating console unit 32.

The operating console unit 32 includes user input devices such as a keyboard and a mouse. The operating console unit 32 is used by an operator, for example, to input such data as an imaging protocol and to set a region where an imaging sequence is to be executed. The data about the imaging protocol and the imaging sequence execution region are output to the controller unit 25.

The data processing unit 31 includes a computer and a recording medium on which a program to be executed by the computer to perform predetermined data processing is recorded. The data processing unit 31 is connected to the controller unit 25 and performs data processing based on control signals received from the controller unit 25. The data processing unit 31 is also connected to the data acquisition unit 24 and generates spectrum data by applying various image processing operations to the magnetic resonance signals output from the data acquisition unit 24.

The display unit 33 includes a display device and displays an image on the display screen of the display device based on control signals received from the controller unit 25. The display unit 33 displays, for example, an image regarding an input item about which the operator inputs operation data from the operating console unit 32. The display unit 33 also displays a slice image of the subject 16 generated by the data processing unit 31.

Different RF coil arrays may be utilized for different scanning objectives. To that end, one or more the RF coil arrays, such as RF coil array 210, may be disconnected from the MRI apparatus 10, so that a different coil array may be connected to the MRI apparatus 10. The RF coil arrays may be coupled to the T/R switch 20, and thus to the RF driver unit 22 and the data acquisition unit 24, via a connector and an RF port interface 21. Each RF coil array may be electrically coupled to one or more connectors (such as connector 17a-17c). The connector(s) may be plugged into the RF port interface 21 to electronically couple the RF coil array to the T/R switch 20. For example, coil array 210 may be electronically coupled to the MRI apparatus 10 by plugging connector 17c into RF port interface 21. As such, the local RF coil arrays may be easily changed.

FIG. 2 shows an example arrangement of RF coil arrays of the MRI apparatus 10 of FIG. 1 relative to the subject 16. In particular, an anterior coil array 210, a head-neck coil array 220, and a posterior coil array 230 are positioned on top of the body, over the head-neck, and under the body, respectively. Each coil array is an individual piece and may be physically separated from each other. One or more of the coil arrays (such as the anterior coil array 210 and head-neck coil array 220) may be connected or removed from the MRI apparatus 10 by the operator. The posterior coil array 230 may be embedded within and moved together with table 26. Each coil array may include one or more coil elements, and each coil element receives MR signals generated from a specific volume of the subject 16. The coil elements may or may not overlap with each other. For example, the anterior coil array 210 includes three rows of coil elements (211-213) arranged along the superior to inferior (S/I) direction. Each row (211, 212, 213) may include multiple (e.g., 4, 5, 6, 7, 8, etc.) coil elements along the direction perpendicular to the S/I direction. The head coil array 220 includes four rows of coil elements (221-224) to cover different surface area of the subject; and the posterior coil array 230 includes six rows of coil elements (231-236) arranged along the S/I direction. In some embodiments, the relative position among the coil elements of a coil array may be fixed with respect to each other. In some embodiments, the relative position among the coil elements of a coil array may be variable relative to each other.

The coil elements of one coil array or coil elements from multiple coil arrays may be grouped into receive element groups (REGs) according to REGs information. The REGs information is predetermined rules for grouping coil elements of the coil array for transmitting and/or receiving MR signals. Different REGs include different combinations of coil elements. A coil element may be included in more than one REG. The REGs information may be determined based on the imaging objective, geometry of the coil array, hardware limitation (e.g., multiple coil elements must be turned on/off at the same time), and so on. The REGs information may further provide exclusive REGs. For example, when one coil element is included in two REGs, the two REGs are exclusive of each other, meaning that they cannot be selected at the same time.

Take anterior coil array 210 as an example. All coil elements in the anterior coil array 210 may be grouped as a first REG. Coil elements in row 211 may be grouped as a second REG; coil elements in row 212 may be grouped as a third REG; and coil elements in row 213 can be grouped as a fourth REG. Coil elements in a column (along the direction perpendicular to the rows) may be grouped as a fifth REG. The first REG and the second REG are exclusive of each other because they both include coil elements in row 211. The second REG and the fifth REG are exclusive of each other because they both include a coil element at the cross of row 212 and the column, and so on. REGs of the posterior coil array 230 may be defined similarly. As another example, coil elements in rows 223 and 224 of the head-neck coil array 220 may be grouped as one neck-piece REG. In some embodiments, each coil element may represent a separate REG. The REGs information may be saved in the memory of the MRI apparatus 10.

Each coil element of the coil arrays is electronically coupled to the controller unit (such as controller unit 25 of FIG. 1) via a channel. In particular, each coil element can sense the MR signals and transfer the MR signal to the data acquisition unit (such as data acquisition unit 24 of FIG. 1) of the MRI apparatus via the corresponding channel. The data acquisition unit then outputs digitized MR signals to the controller unit. As such, the channels of the coil arrays may also be grouped according to the REGs information. In some examples, each individual coil element may be coupled to one channel, and each channel may only be coupled to one coil element (e.g., anterior coil array 210 may include 12 coil elements coupled to the data acquisition unit via 12 separate channels). In other examples, more than one coil element may be coupled to a given channel (e.g., anterior coil array 210 may include 12 coil elements coupled to the data acquisition unit via 6 separate channels).

FIG. 3 shows an example method 300 for performing an exam of the imaging subject using the MRI apparatus (such as the MRI apparatus 10 of FIG. 1). The MRI image is reconstructed from data acquired based on a dynamic coil mode during a higher resolution main scan. The dynamic coil mode defines the REGs that are selected for imaging the ROI. The REGs are selected based on each REG's sensitivity to MR signals generated within and outside of the ROI. In particular, during the calibration scan, each coil element of each REG that overlaps with the FOV may be set to receive the MR signals. Based on signals received from each coil element, a coil element sensitivity of the respective coil element is determined. The coil element sensitivities may be combined according to the REG information (e.g., the information that defines which coil elements are in which REGs) to generate a plurality of REG sensitivity maps. The REG sensitivity maps are then used along with a ROI profile that defines the ROI along the coil selection direction and a penalty curve that assigns weight/significance to REG sensitivity outside the ROI, in order to select one or more REGs that have a higher sensitivity to MR signals within the ROI than outside the ROI. Method 300 also includes displaying a visual representation of the selected REG, to help the operator verify or adjust the coil array position and/or the ROI before the main scan. When a plurality of RF coil arrays are plugged into the MRI apparatus, each RF coil array may be considered individually. That is, a dynamic coil mode may be determined for each coil array. Alternatively, the RF coil arrays may be considered collectively, and a dynamic coil mode maybe determined for all of the coil arrays. Method 300 may be executed by controller unit 25 of FIG. 1 according to instructions stored in non-transitory memory.

At 302, responsive to the operator's instruction, the table (such as table 26 of FIG. 1) is moved to position the subject (such as a patient) in the imaging space (such as imaging space 18 of FIG. 1).

At 304, information of the coil arrays that are arranged around the patient is received at the controller unit, so that the type of the coil arrays may be identified. The information of the coil arrays may be received via the operator input. Alternatively, the MRI apparatus may automatically identify the coil array type, for example, by identifying the connector (such as connectors 17a-17c of FIG. 1) of the coil array that has been plugged into the apparatus. Method 300 may load the REGs information related to the coil arrays that are connected to the MRI apparatus. The connected coil arrays may also be displayed to the operator via the display unit.

At 306, operator input is received at the controller unit regarding the patient information and the imaging protocol. In particular, the operator may select the protocol based on the anatomy that is going to be scanned. By selecting a protocol, a field of view (FOV) may be determined correspondingly. The FOV defines a three-dimensional volume of the patient. In one example, the FOV defines the volume that is going to be scanned for the localizer scan and the calibration scan. In some examples, the FOV may include an entirety of the imaging subject/MRI bore volume that the MRI system is capable of imaging without moving the table on which the imaging subject is placed. In one example, the protocol may be selected such that the phase encoding direction is aligned with the coil selection direction. For example, the phase encoding direction may be selected to be within a threshold angle from the coil selection direction. The threshold angle may be a predetermined angle (such as 45 degrees) less than 90 degrees. By aligning the phase encoding direction with the coil selection direction, the phase wrap artifact may be more effectively reduced via selecting the REGs based on the penalty curve.

At 308, a localizer scan is performed via the controller unit (e.g., the controller unit may send commands to the components of the MRI system to execute the localizer scan). The localizer scan may be a lower resolution scan of the FOV. Herein, the lower resolution scan is a scan with large voxel volume, which can be completed with reduced measurement time. In one example, the image data acquired during the localizer scan may be used to reconstruct an MR image of the FOV. The localizer scan may generate one or more 2D images of the subject, for example, in the sagittal, coronal, and/or the transverse planes.

At 310, a full mode low resolution calibration scan is performed in the calibration FOV via the controller unit (e.g., the controller unit may send commands to the components of the MRI system to execute the localizer scan). The calibration FOV may be either the same as or different than the localizer FOV. During the full mode calibration scan, each coil element of one or more of the coil arrays receives MR signals. One 3D dataset is generated from MR signals received from each channel corresponding to the coil element. As such, each 3D dataset corresponds to one channel of the plurality of channels, and to one coil element to which the channel is electronically coupled. In some embodiments, MR signals from all channels of all coil arrays are collected. In some embodiments, MR signals from channels of selected coil arrays are collected. The coil arrays may be selected based on the relative position of the coil array from the imaging area or the FOV. For example, coil arrays that are within a threshold distance from the scan center are set in the receiving mode during the calibration scan, while the non-selected coil arrays do not receive the MR signals. The threshold distance may be a distance within which the coil array is sensitive to the MR signals along the coil selection direction. In yet another embodiment, each coil element of selected REGs receives the MR signals, while the non-selected REGs do not receive the MR signals. The coil arrays may be selected based on the relative position of the REG from the imaging area or the FOV. For example, coil arrays that are within a threshold distance from the FOV and/or scan center are selected. The threshold distance may be a distance within which the REG is sensitive to the MR signals along the coil selection direction. The relative position of the coil array and the REG relative to the FOV and/or scan center may be estimated based on prior knowledge such as the type of the coil array. In one embodiment, the localizer scan and the calibration scan may be combined, wherein a low resolution 3D scan of the FOV may generate both the localizer scan image and the calibration data.

At 312, a ROI selected by the operator is received at the controller unit. For example, images generated by the localizer scan may be displayed on the display unit, and the operator may select the ROI for the main scan based on the images. The ROI may be smaller than the localizer FOV, at least in some examples. In some embodiments, the ROI may be defined by selection of the position of the corners of a 3D volume. In some embodiments, the ROI may be defined by the center position and ranges in each of the superior-inferior, medial-lateral, and posterior-anterior directions. In yet other embodiments, the ROI may be in the shape of a cube, which is defined by the center position and a range, and a rotational angle. For example, for cardiac scan, the ROI may be defined by the center position of the heart and a predetermined range.

At 314, method 300 determines via the controller unit if the ROI is beyond the calibration FOV (e.g., beyond the FOV imaged by the MRI system during the calibration scan). For example, when the operator indicates the ROI, the ROI may extend outside of the calibration FOV. If the ROI extends beyond the calibration FOV, method 300 proceeds to 315 to adjust the full mode calibration center and re-perform the full mode calibration scan. For example, the table may be moved or other action may be performed to adjust the center of the calibration FOV in order to maintain the ROI within the calibration FOV. Upon adjusting the calibration center and re-performing the calibration scan, method 300 proceeds to 316.

If it is determined at 314 that the ROI does not extend beyond the calibration FOV or the calibration scan is re-performed at 315 with an adjusted calibration center, method 300 proceeds to 316 to generate, via the controller unit, REG sensitivity maps based on the calibration scan and the ROI selection. Processes of generating the REG sensitivity maps are described in more detail below with respect to FIG. 4.

At 316, REG sensitivity maps are generated based on data acquired during the full mode calibration scan. In particular, a plurality of 3D datasets are obtained from the calibration scan. Each 3D dataset is acquired from a particular coil element (or a particular channel). The coil element sensitivity of the particular coil element may then be determined by projecting the corresponding 3D dataset along a coil selection direction, as shown in FIG. 5. As such, each coil element corresponds to one coil element sensitivity. The coil element sensitivities of the plurality of coil elements are combined to generate REG sensitivities according to predetermined REG information. The REG sensitivity maps may be constructed based on the generated REG sensitivities. Details regarding generating the REG sensitivity maps are presented in FIG. 4.

At 317, a dynamic coil mode is generated based on the penalty curve determined at 315, the REG sensitivity maps generated at 316, and the ROI received at 312. The dynamic coil mode determines the REG(s) to be used for imaging the ROI during the main scan. Processes of generating the dynamic coil mode are described in more detail below with respect to FIG. 11.

At 318, a visual representation of the dynamic coil mode is displayed together with images acquired via the localizer scan at 308 via the display unit. An example visual representation is shown in FIG. 13. Briefly, an image of the imaging subject acquired during the localizer scan may be displayed along with the slice position and the extent of sensitivity of the selected REG. Further, an overlapped area between REGs may also be displayed. In this disclosure, the extent of a REG is used interchangeable with the extent of sensitivity of a REG.

At 320, method 300 includes receiving an input at the controller unit from the operator indicating whether the current dynamic coil mode is ideal, e.g., based on the displayed dynamic coil mode at 318. For example, based on the display, the operator may determine whether the position of the ROI and/or the extent of the REG(s) are satisfactory. In one example, the operator may determine whether the extent of the REGs of the dynamic coil mode matches the ROI. If the ROI does not match the selected REGs, the operator may adjust the position of the coil array. In another example, the operator may determine whether the overlap between the REGs is too large. Responsive to the overlap being greater than a threshold overlap, the operator may readjust the position of one or more of the coil arrays. If the controller unit receives the confirmation for the dynamic coil mode, method 300 proceeds to 326 and executes the main scan, which is described in more detail below. Otherwise, if the operator determines that the dynamic coil mode is not ideal, method 300 proceeds to 322.

At 322, method 300 determines via the controller unit if one or more of the receive RF coil arrays to be used in the main scan need be repositioned so that the ROI is fully covered. If one or more RF coil arrays need be repositioned, method 300 proceeds to 324 to reposition the RF coil array(s). For example, if the anterior RF coil array does not fully cover the ROI, the table may be moved so that the imaging subject is out of the bore of the MRI system and the operator may reposition the anterior RF coil array (e.g., move the RF coil array up or down on the imaging subject). In still further examples, additionally or alternatively, the table may be moved and/or the imaging subject may be moved so that the absolute position of ROI is adjusted (e.g., the same anatomy may be included in the ROI, but the ROI may be in a different position relative to the MRI system and RF coil arrays). Upon repositioning of the RF coil array(s), method 300 proceeds to 308 to re-perform the localizer scan, re-perform the calibration scan, obtain the ROI, etc. If the RF coil array(s) that are to be used in the main scan are not to be repositioned, method 300 loops back to 312 to obtain a new ROI. The new ROI may be smaller than the previous ROI, which may facilitate full coverage of the ROI by one or more REGs.

At 326, the main scan is executed over the ROI using the dynamic coil mode via the controller unit (e.g., the controller unit may send commands to the components of the MRI system to execute the main scan). In particular, during the main scan, MR signals are received from coil elements in the REGs selected based on the dynamic coil mode, but not from any coil elements that are not in the selected REGs. In other words, the coil elements not in the selected REGs are turned off during the main scan. The main scan is a high resolution 3D scan to generate high quality images of the ROI. The main scan has a lower voxel volume than the localizer scan at 308 and the calibration scan at 312. Executing the main scan may further include reconstructing and displaying one or more MRI images based on the received MR signals.

At 328, method 300 determines via the controller unit whether the exam (e.g., the current scan session) is completed. The scan session may be ended via the operator input. Alternatively, method 300 may determine whether the scan session is ended based on the imaging protocol selected at 306. If the session is not ended, method 300 proceeds to 312 to receive a new selection of a ROI.

Figure 4:
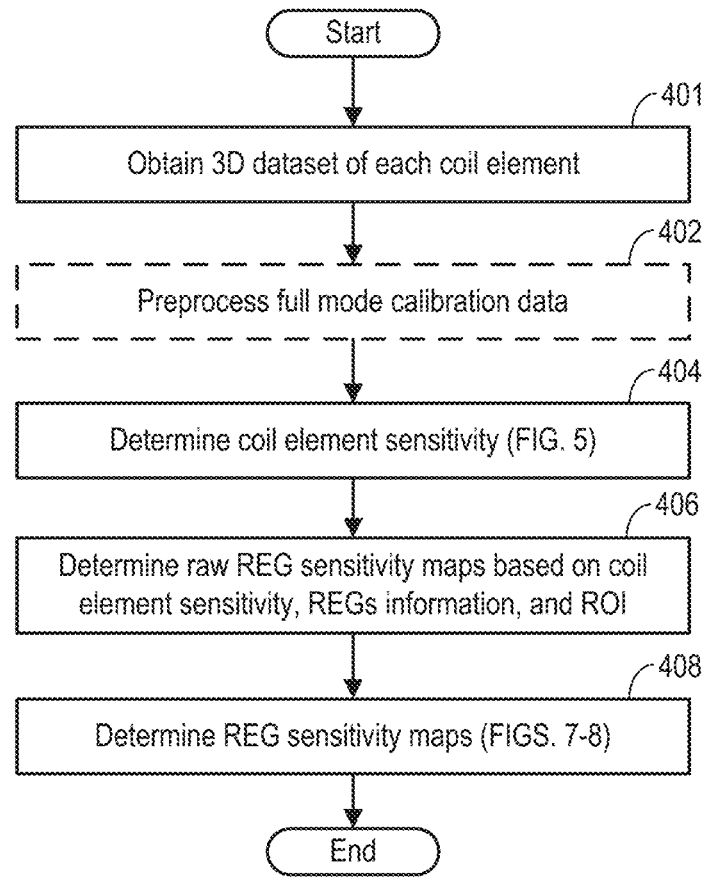
FIG. 4 is a flow chart illustrating an example subroutine for determining a receive element group (REG) sensitivity map.

FIG. 4 shows example subroutine 400 for determining REG sensitivity maps. The REG sensitivity maps include a REG sensitivity for each of one or more REGs. In particular, REG sensitivity maps are first generated based on the coil element sensitivity of each coil element or each corresponding channel. The raw REG sensitivity maps may then be extrapolated to REGs within or outside of the FOV based on the configuration of the coil array.

At 401, after performing the full mode calibration scan at 312 of FIG. 3, a 3D dataset is obtained from each coil element that is set to the receiving mode during the full mode calibration scan. Each 3D dataset is received from each channel coupled to the coil element. For example, if N coil elements are set to the receiving mode during the full mode calibration scan, N 3D datasets are acquired, each dataset corresponding to one coil element. The 3D dataset may be in image space. That is, the value of each data point in the 3D dataset corresponds to the strength of the MR signal received from the respective coil element. The spatial location of the data point is the location of the MR signal source.

At 402, subroutine 400 optionally includes processing the plurality of obtained 3D datasets. In particular, error corrections may be performed on each 3D dataset of each coil element. For example, one or more error maps, such as the frequency map, the phase map, and slice gradwarp error map may be applied to the dataset to correct spatial distortions. Through the preprocessing, errors in spatial location of each data point of the digitized MR signals may be corrected.

At 404, one 1D coil element sensitivity for each coil element (or for each channel) is generated based on the acquired datasets. For example, if N coil elements are set to the receiving mode during the full mode calibration scan, N 3D datasets are acquired, and N coil element sensitivities are determined. Specifically, each 3D dataset acquired during the calibration scan may be projected onto the coil selection direction. In one example, the coil selection direction may be the S/I direction.

FIG. 5 illustrates an example coil element sensitivity 510 obtained by projecting a 3D dataset 505 onto the S/I direction. The 3D dataset 505 may first be projected onto the sagittal plane 504 along the medial-lateral (R/L) direction 502. For example, to project the 3D dataset to a 2D plane, data points along the medial-lateral direction 502 are summed to obtain a data point in the sagittal plane 504. Then, the projected 2D data may be projected again onto the S/I direction to obtain the coil element sensitivity 510.

In one example, the coil selection direction may be a direction along which coil elements have different coverages. In other words, the extent of one or more coil elements covers different regions along the coil selection direction. For example, if an RF coil array comprises a four by four array of coil elements, the RF coil array may be arranged into four REGs, each REG comprising a row of coil elements extending along a first direction (e.g., horizontally). The coil selection direction may be along a second direction perpendicular to the first direction (e.g., vertical), as the coil elements of each REG has different coverage along the second direction. In another example, if the RF coil array is arranged into four REGs with each REG comprising a column extending along the second direction, the coil selection direction may be along the first direction. In one example, the RF coil array may include REGs that have different coverages in more than one direction. The coil selection direction may be one of the multiple directions, determined based on the imaging protocol. In another example, the coil selection direction may be the same as the slice selection direction during the MRI scan. In other words, the coil selection direction is perpendicular to the plane containing the imaging slice. The coil selection direction may also be the same as the scan direction.

At 406, raw REG sensitivity maps are generated based on the coil element sensitivities from 404 and the REGs information. In one example, for each REG, the coil sensitivities of the coil elements included in the REG are combined, such as by summing, to generate a raw REG sensitivity.

FIG. 6 shows an example set of raw REG sensitivity maps 601. They axis is an index of the REGs (e.g., each REG is represented individually on the y axis). Each row corresponds to the REG sensitivity of the respective REG. Four REGs are included. The x axis indicates distance (such as in pixels or cm) along the S/I direction. The raw REG sensitivity values are color coded in grayscale. Each REG is sensitive to MR signals generated from different ranges along the S/I direction.

Figure 7:
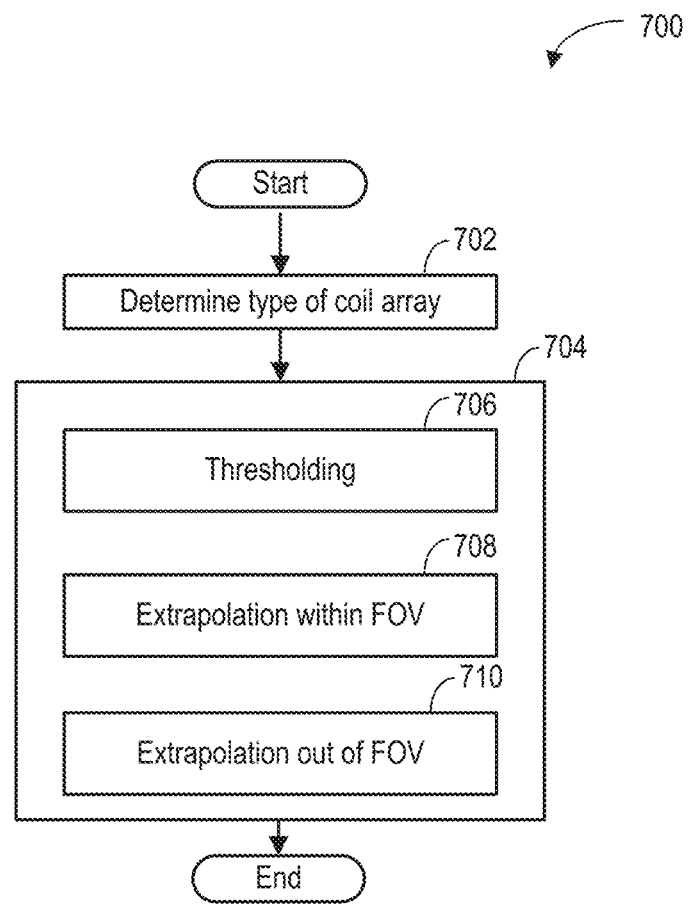
FIG. 7 a flow chart illustrating an example subroutine for generating a receive element group (REG) sensitivity map.

FIG. 7 shows subroutine 700 for generating REG sensitivity maps based on raw REG sensitivity maps, such as the raw REG sensitivity maps 601 of FIG. 6. The raw REG sensitivity maps may be processed based on the type of the coil array. FIGS. 8A-8C show examples of REG sensitivity maps generated based on the raw REG sensitivity maps via subroutine 700.

At 702, the type of the coil array represented in the raw REG sensitivity maps is determined. For example, the subroutine may determine if the RF coil array is a fixed-to-table coil (e.g., posterior coil), floating coil (e.g., anterior coil), rigid coil (e.g., head and neck coil), flexible coil (e.g., air coil), or other type of RF coil array. In other examples, the subroutine may determine the length of the RF coil array (e.g., relative to the FOV) and/or number of REGs in the RF coil array.

At 704, the sensitivity of each REG in the raw REG sensitivity maps may be processed based on the type of coil array. In one example, at 706, the raw REG sensitivity maps are thresholded with a threshold sensitivity level. The threshold sensitivity level may be determined based on the noise level of the MR signals. Any data point of the REG sensitivity maps having a value lower than the threshold sensitivity level is set to a fixed low level (such as zero). An example set of raw REG sensitivity maps 801 is shown in FIG. 8A for an RF coil array having four REGs, such as the head-neck coil array. Similar to the raw REG sensitivity maps 601 of FIG. 6, each row of the raw REG sensitivity maps 801 represents the combined sensitivity of one REG along the coil selection direction. After thresholding, low level data points are discarded by setting those data points (e.g., pixels) to a zero value. The sensitivity extent for each REG can be determined as the extent of non-zero sensitivity of the REG. For example, the extent 810 of the first REG 811 is shown in FIG. 8A.

In another example, additionally or alternatively, the processing may include replacing the thresholded sensitivity of each REG with a Gaussian fitting of the same extent. The Gaussian fitting replacement may be applied to REGs of an anterior coil array or a posterior coil array, for example. In one example, as shown in FIG. 8B, the thresholded sensitivity of the first REG of raw REGs sensitivity maps 803 is replaced with Gaussian fitting 822. The Gaussian fitting 822 is shown in grayscale of REG sensitivity maps 804. For each row of the raw REG sensitivity maps, the thresholded sensitivity values are replaced with a Gaussian curve of the same extent along the coil selection direction (such as the S/I direction). In one example, the Gaussian curve is determined by fitting the thresholded sensitivity of the REG. In another embodiment, the Gaussian curve has a maximum value and variance determined by the original signal (e.g., the maximum value is the same as or similar to the maximum value of the original signal).

In an example, at 708, the REG sensitivity maps may be extrapolated within the FOV. In one example, the REG sensitivity maps may be extrapolated to the REGs not receiving MR signals during the calibration scan. In another example, the REG sensitivity maps may be extrapolated to the REGs that receive low amplitude MR signals during the calibration scan. The REG sensitivity maps may be extrapolated based on the information of the REGs of the coil array.

For example, the sensitivity of a first REG included in the REG sensitivity maps may be extrapolated to a second REG if the second REG has the same configuration as the first REG. The configuration may include the number and type of coil elements, relative position of the coil elements, and the rigidity of the coil array.

FIG. 8B shows an example of extrapolated REG sensitivity maps 804 of an anterior coil array based on the raw REG sensitivity maps 803. In the raw REG sensitivity maps 803, the sixth REG has low values. As such, all values of the sixth REG in the REG sensitivity maps 803 are set to zero during the thresholding process. As the sixth REG is of the same type of the fifth REG, and the relative position of the sixth REG and the fifth REG is assumed to be the same as the relative position of the fifth REG and the fourth REG, the sensitivity of the sixth REG may be determined based on the sensitivity of the fifth REG. In one example, sensitivity of the sixth REG 805 is added to the REG sensitivity maps 804 by shifting the sensitivity of the fifth REG based on the relative position between the fifth and sixth REGs. In another example, sensitivity for the sixth REG may be a Gaussian curve with an extent the same as the extent of the fifth REG. As such, without an additional calibration scan, the extrapolated REG sensitivity maps 804 may be generated to cover the full FOV 820 along the S/I direction.

In yet another example, at 710, the REG sensitivity maps may be extrapolated outside of the FOV. The extrapolation may be based on similarity of the REGs, the coil array rigidity, and type and position of the coil elements. Extrapolation outside of the FOV may be applied to posterior coil arrays or other arrays with coil elements that lie outside the FOV and/or that are not prone to movement or positioning variability. As the calibration scan may not be able to cover the full extent of the coil array along the coil selection direction, by extrapolating the REG sensitivity map outside of the FOV, REG sensitivity maps for the entire coil array may be obtained based on one calibration scan of the imaging area.

FIG. 8C shows an example of extrapolated REG sensitivity maps 807 of a posterior coil array based on the raw REG sensitivity maps 806. The raw REG sensitivity maps 806 may be generated by executing a calibration scan within FOV 830 and projecting the data along the S/I direction. As the REGs outside of the FOV 830 are similar to the REGs within the FOV (similar in that the REGs may have the same number of coil elements, be spaced apart by an equal manner, etc.), the REG sensitivity maps after thresholding and Gaussian fitting replacement may be extrapolated to cover the entire extent 831 of the coil array. In one example, as the relative positions among the coil elements of the posterior array are fixed, the REG sensitivity maps may be extrapolated outside of the FOV 830 by shifting the REG sensitivity maps within FOV 830 based on prior knowledge of relative positions between the REGs in the posterior coil array.

FIG. 9A shows an MRI image 910 of the hand/wrist region acquired with a hand/wrist coil. Arrow 905 shows the coil selection direction. MRI signals received from two REGs 903 and 904 are used for reconstructing the image 910. The two REGs 903 and 904 are arranged along the coil selection direction 905, and cover different ranges in the coil selection direction 905. The coil selection direction may be the same as the phase encoding direction. Because part of the REG 903 covers a region 906 outside of the imaging region of image 910, REG 903 can receive MR signals generated in the region 906. As a result, a phase wrap artifact is produced, shown herein as the image of a finger 902 overlapped with the image of the wrist.

FIG. 9B shows an MRI image 920 of the same ROI as image 910. Different from image 910, in FIG. 9B, only REG 904 is used for receiving the MR signals, while the REG 903 does not receive MR signals. As a result, the reconstructed image 920 from signals received from REG 904 is free of the phase wrap artifact. However, since fewer REGs are used for acquiring the MR signals, the signal to noise ratio (SNR) of image 920 may be lower than the SNR of 910.

FIG. 10 shows examples of penalty curves determined based on a ROI. Graph 1010 shows an ROI profile having an extent 1011 from S to T. The value of the ROI profile is one within the extent 1011, and is zero outside of the extent 1011. Graph 1020 shows three example types of penalty curve. The three types of the penalty curves are of different shapes. The x-axes of graphs 1010 and 1020 are the distance in the coil selection direction. The penalty curves have zero value within the extent 1011 of the ROI. The first type of penalty curve has a constant value outside of the ROI. For example, penalty curve 1021 is one outside of the ROI extent 1011. The value of the second type penalty curve increases as the distance from the ROI increases. For example, penalty curve 1022 increases linearly as the distance from the ROI increases. The third type of penalty curve is based on the FOV rather than ROI, and as such is zero within the FOV, and is nonzero outside of the FOV. For example, penalty curve 1023 is zero within FOV 1024, and is a constant value (such as two) outside of the FOV. The shape of the penalty curves may be determined based on the type and configuration of the coil array and the imaging objective. For example, when imaging a wrist with a hand/wrist coil array, the first type of penalty curve may be selected to penalize the signals generated from the fingers. In some examples, the shape and value of the penalty curve may be specifically tuned for a particular coil array and/or imaging objective. For example, the penalty curve may be determined by imaging a phantom during a calibration process.

FIG. 11 shows an example subroutine 1100 for determining the dynamic coil mode. The dynamic coil mode includes selected REGs for imaging a particular ROI, where the selected REGs may include some but not all of the REGs of the RF coil array. The REGs may be selected based on the REG sensitivity, the ROI, and the penalty curve. In particular, a net signal is calculated for each REG. The net signal is the difference between the signals within the ROI (e.g., sensitivity of the REG to MR signals generated within/received within the ROI) and the signals outside of the ROI weighted by a penalty curve. The total signal outside of the ROI represents the sensitivity of the REG to MR signals generated/received outside the ROI. The penalty curve represents the significance of the potential phase wrap artifact caused by the signals outside the ROI to which the REG contributes. As an example, a negative net signal indicates that the REG may contribute more to the phase wrap artifact than the artifact free MRI image of the ROI.

At 1102, the first REG from the REG sensitivity maps generated from 316 of FIG. 3 is selected. The REG sensitivity of the selected REG is represented by the corresponding row of the REG sensitivity maps (e.g., the REG sensitivity for a first REG is shown in the first row of REG sensitivity maps 601).

At 1104, the signal within the ROI and the signal outside of the ROI for the selected REG (e.g., the first REG) are determined based on the REG sensitivity and the ROI. In particular, for each REG, the signals within the ROI are the REG sensitivity values that are within the extent of the ROI. The signals outside the ROI are the REG sensitivity values that are outside the extent of the ROI. Herein, the signals within the ROI represents the sensitivity of the REG to the MR signals generated within the ROI, and the signals outside the ROI represents the sensitivity of the REG to the MR signals generated outside the ROI.

At 1106, the net signal of each REG is calculated based on the perspective signal inside the ROI, the perspective signal outside the ROI, and a phase wrap penalty curve.

The penalty curve may define a significance of REG sensitivity to MR signals generated outside the ROI, as a function of distance from the ROI along the coil selection direction. In some embodiments, the penalty curve is predefined. In further embodiments, multiple penalty curves with different shapes and/or value(s) are predefined and one is selected based on the imaging objective and/or the coil array arrangement. In some embodiments, the penalty curve may be determined/adjusted real-time. For example, a first imaging protocol (e.g., for a hand) may include a penalty curve that assigns no significance (e.g., value of zero) to signals generated inside the ROI and then assigns a constant significance (e.g., value of one) to signals generated outside the ROI. A second imaging protocol (e.g., for an ankle) may include a penalty curve that assigns no significance (e.g., value of zero) to signals generated inside the ROI and then assigns a linearly-increasing significance (e.g., value of one increasing to a value of three linearly with distance from the ROI) to signals generated outside the ROI. Examples of the penalty curve are shown in FIG. 10.

In some embodiments, the penalty curve may be adjusted based on the ROI received at 312 or the FOV determined at 306. For example, the penalty curve may be adjusted to be zero within the ROI, and may be non-zero outside of the FOV. As another example, the penalty curve may be determined based on the type of the coil array.

As another example, the penalty curve may be determined based on the coil selection direction and the imaging protocol. The penalty curve may be determined based on the angle of the coil selection direction and the direction causing the phase wrap artifact. For example, the direction causing the phase wrap artifact may be the phase encoding direction. The value of the penalty curve may increase responsive to decreased angle between the coil selection direction and the direction causing the phase wrap artifact. In other words, higher penalties may be applied to the signal outside of the ROI when the coil selection direction is more aligned with the direction of the phase wrap artifact. In this way, the phase wrap artifact may be more effectively addressed by selecting the REGs.

As another example, the penalty curve may be set to zero everywhere responsive to the coil selection direction perpendicular to the direction causing the phase wrap artifact. When the coil selection direction is along the frequency encoding direction, the wrap artifact may be removed by increasing the readout sampling rate with little scan time increase. Thus, phase wrap penalty may be avoided during coil selection.

As yet another example, the penalty curve may be determined based on the extent of the ROI or the extent of the data acquisition FOV (or encoding FOV). When the extent of the ROI or the extent of the FOV is greater than the threshold value, the penalty curve may be set to zero value everywhere. By setting the penalty curve to zero value everywhere, no penalty is applied to the MR signals received outside of the ROI. In one example, by setting the penalty curve to zero value everywhere, all REGs that overlap with the ROI may be included in the dynamic coil mode.

The net signal ΔS of each REG may be calculated as a difference between the signals within the ROI and the signals outside of the ROI weighted by the penalty curve. The net signal may be expressed as the difference between the dot product of the REG sensitivity and the ROI profile, and dot produced of the REG sensitivity and the phase wrap penalty curve:

$$\Delta S = REG \cdot ROI - REG \cdot P = \sum_{i=1}^{N} REG_i \times ROI_i - \sum_{i=1}^{N} REG_i \times P_i,$$  Equation 1 wherein REG is the REG sensitivity of the selected REG at 1102, ROI is the ROI profile (such as ROI profile in graph 1010 of FIG. 10), P is the penalty curve (such as penalty curves in graph 1020 of FIG. 10), N is the number of data points of the REG sensitivity, and i is the ith data point along the coil selection direction. The coil selection direction is the SIT direction, for example. If the ROI profile is one within the extent of the ROI, and is zero everywhere else, the first term REG·ROI of Equation 1 is the sum of the REG sensitivity within the ROI. The second term REG·P of Equation 2 is the sum of the REG sensitivity outside the ROI weighted by the penal curve. In other words, each REG sensitivity value outside of the ROI is first multiplied by a corresponding value of the penalty curve, and the weighted REG sensitivity values are then summed up.

In another example, when the ROI profile is one within its extent from S to T, and zero everywhere else (as shown in graph 1010 of FIG. 10) and the penalty curve is a constant value (for example, the constant value is penalty parameter p) outside of the ROI, the net signal ΔS may be calculated as the difference between a total signal $S_1$ within the ROI and a total signal $S_2$ outside of the ROI weighted by a penalty parameter p. The total signal within the ROI is a sum of the REG sensitivity within the ROI: $S_1 = \sum_{i=S}^{T} REG_i$. The total signal outside of the ROI is a sum of the REG sensitivity outside the ROI: $S_2 = \sum_{i=1}^{S-1} REG_i + \sum_{i=T+1}^{N} REG_i$. The net signal is the difference between the total signal within the ROI and the total signal outside the ROI weighted by the penalty parameter. The net signal ΔS may be expressed as:

$$\Delta S = S_1 - p \times S_2.$$  Equation 2

At 1108, the net signal is compared with a predetermined first threshold. The first threshold may be predetermined during system calibration with a phantom. In one example, the first threshold is zero. If the net signal is greater than the first threshold, the REG is included in the dynamic coil mode at 1110. Otherwise, the REG is excluded from the dynamic coil mode at 1112.

At 1114, if the current REG is the last REG in the REG sensitivity map (e.g., the net signal has been determined for each REG of the RF coil array), the subroutine moves to 1114. Otherwise, the next REG in the REG sensitivity map is selected at 1116 and the subroutine loops back to 1104 to determine the total signal within the ROI and outside the ROI for the next REG.

At 1118, the number of the selected REGs in the dynamic coil mode is checked. If the number of the selected REGs is nonzero, the subroutine 1100 exits. In this way, at least one REG has been identified for inclusion in the dynamic coil mode, and the main scan may commence with the selected REG(s). If there is no selected REG in the dynamic coil mode, the total signal within the ROI of each REG in the REG sensitivity map is compared to a second threshold at 1120. In one example, the total signal within the ROI may be calculated as the dot product of REG sensitivity and the ROI profile. In another example, the total signal within the ROI maybe the sum of the REG sensitivity within the ROI. The second threshold may be above zero. In one example, the second threshold may be the minimal sensitivity to the received MR signal. In another example, the second threshold may be determined based on the noise level of the received MR signal, wherein the second threshold is higher than the noise level. In yet another example, the second threshold may be the highest noise level of the received MR signals. If the total signal of each REG within the ROI is lower than the second threshold, the ROI is outside the coverage (e.g., sensitivity extents) of the REG sensitivity maps. The lack of coverage of the REG sensitivity maps may be shown to the operator in the visual representation of the dynamic coil mode. The operator may then re-adjust the coil array position. If the total signal within the ROI of at least one REG is greater than the second threshold, subroutine 1100 proceeds to 1122 and the REG that has the highest total signal within the ROI is included in the dynamic coil mode. In this way, at least one REG is identified for inclusion in the dynamic coil mode, and the main scan may commence with the selected REG(s). The subroutine 1100 exits.

In some examples, additional constraints may be applied to generate the dynamic coil mode. For example, after evaluating the REGs based on the net sensitivities, the REGs that are included in the dynamic coil mode may be further evaluated to determine whether the identified REGs are compatible with each other. The identified REGs might be exclusive of each other. Taking the coil array arrangement of FIG. 2 as an example, if the first REG consists of all coil elements in the anterior coil array 210 and the second REG consists of coil elements in row 211, the first and second REGs are exclusive of each other because they both include coil elements in row 211. Therefore, in some embodiments, tiebreaker rules may be applied to select one REG from exclusive REGs. For example, if parallel imaging is used, a bigger REG (i.e., the first REG) is preferred; while if reduction of phase wrap artifact is preferred, a smaller REG (i.e., the second REG) is preferred. In some embodiments, multiple factors are considered in totality and the REG that strikes the best balance is selected from exclusive REGs.

In this way, the dynamic coil mode is identified based on the REG sensitivity within and outside of the ROI as well as a penalty curve that defines the weighting (or significance) that is to be given to the contribution of the MR signals outside the ROI to the phase wrap artifact. By adjusting the shape and/or value of the penalty curve, the REG sensitivity outside of the ROI is penalized differently. For example, when the penalty curve is constant value outside of the ROI (such as penalty curve 1021 of FIG. 10), MR signals generated at different distances from the ROI are treated equally. In another example, when the penalty curve is linearly increased with increased distance from the ROI (such as penalty curve 1022 of FIG. 4), MR signals generated further away from the ROI are penalized more. In yet another example, increasing the values of the penalty curve and increasing the first threshold at 1108 may both effectively increase the penalty applied to the MR signals generated outside of the ROI and reduce the likelihood phase wrap artifacts will occur. However, this more stringent approach may reduce SNR and hence image quality of the final reconstructed images, and thus a balance may be made between reduction of phase wrap artifacts and SNR. For example, the second penalty curve described above with respect to FIG. 10 may have a penalty that increases as a function of distance from the ROI. This may allow for REGs that are near the ROI boundary to be included in the dynamic coil mode, increasing the number of coil elements used for imaging.

FIGS. 12A-12C show examples of dynamic coil modes determined based on ROIs of different extents and the REG sensitivity maps. As the REG sensitivity maps of the examples shown in FIGS. 12A-12C are the same, FIGS. 12A-12C show effects of the ROI size on the dynamic coil mode.

In FIG. 12A, the REG sensitivity maps 1212 include two REGs. The ROI profile 1210 has an extent of 1211. The x-axes (for both the REG sensitivity maps 1212 and the ROI profile 1210) are the distance along the coil selection direction. The y-axis of the REG sensitivity map 1212 is the index of the REG. In this example, the net signal of the first REG is greater than the first threshold of zero, the net signal of the second REG is less than the first threshold (e.g., due to the majority of the sensitivity extent of the first REG overlapping the ROI with a majority of the sensitivity extent of the second REG not overlapping the ROI). As such, the first REG is included in the dynamic coil mode, and the second REG is excluded from the dynamic coil mode.

In FIG. 12B, the REG sensitivity maps 1212 remain the same as in the first example of FIG. 12A. The ROI profile 1220 has a smaller extent 1221 than the extent 1211 of ROI profile 1210. Due to the small ROI, the net signals of the first REG and the second REG are both less than the first threshold of zero. The total signal of the first REG within the ROI is greater than the second threshold and the total signal of the second REG within the ROI is not greater than the second threshold. As such, the first REG is included in the dynamic coil mode, and the second REG is excluded from the dynamic coil mode.

In FIG. 12C, the REG sensitivity maps 1212 remain the same as in the first example of FIG. 12A. The ROI profile 1230 has an extent 1231. The net signals of the first REG and the second REG are both less than the first threshold of zero. Further, the total signals of the first REG within the ROI and the total signals of the second REG within the ROI are both less than the second threshold. As such, no REG is selected in the dynamic coil mode. The ROI position and the extents of the REGs may be displayed to the operator via a visual presentation as explained above with respect to FIG. 3. The visual presentation may indicate that there is a mismatch between the ROI and the dynamic coil mode.

FIG. 13 is an example visual representation of the dynamic coil mode displayed with image 1302 of the imaging subject acquired from localizer scan. The image 1302 shows the subject in the sagittal plane. Extent 1304 of a first REG and extent 1306 of a second REG are shown on left side of the image 1302. The first REG includes coil elements of, for example, the first anterior coil array. The second REG includes coil elements of, for example, the second anterior coil array. The extent 1308 of a third REG is shown on the right side of the image 1302 relative to the subject. The third REG is from, for example, the posterior array, and is selected according to the dynamic coil mode. Lines 1310 in the posterior-anterior direction show position of the slices for the main scan. Overlapped area 1307 between extent 1304 and 1306 is displayed on top of the image 1302. For example, the overlapped area may be displayed by shading the area with a color. In one embodiment, if the extent of the overlapped area along the extent of the REG exceeds a predetermined threshold value, the overlapped area may be shaded with a second color indicating excessive overlap between the REGs in the dynamic coil mode. Excessive overlap between the REGs may lead to higher noise level. Responsive to excessive overlap, the operator may re-adjust the coil array position to reduce the overlapped area between REGs. In this way, signal to noise level of the received MR signals may be increased. Alternatively, the operator may command to proceed with the main scan with the current REG position. The REG extents 1304 and 1306 may also be displayed in the second color indicating error in the REG selection of the anterior coil array. If the extent of the overlapped area is less or equal to the threshold value, the extents of 1304 and 1306 may be shaded with a first color indicating proper overlap between the REGs. As the extent 1308 fully covers the ROI, the extent 1308 is displayed in the first color indicating proper REG selection of the posterior coil array.

The technical effect of selecting the REGs for MRI based on the REG sensitivity within and outside of the ROI is that the contribution of the received MR signals generated outside of the ROI to the phase wrap artifact may be evaluated. The technical effect of selecting the REGs based on the penalty curve is that the phase wrap artifact may be reduced without increasing the scan time. Further, suppression of the phase wrap artifact may be tuned by adjusting the penalty curve. The technical effect of selecting the shape of the penalty curve is that MR signals generated at particular locations along the coil selection direction may be suppressed responsive to the imaging objective.

In one embodiment, a method for magnetic resonance imaging (MRI) with a radio frequency (RF) coil array comprising a plurality of coil elements includes, grouping the plurality of coil elements into receive elements groups (REGs) according to REGs information; generating coil element sensitivity maps for the plurality of coil elements; generating REG sensitivity maps based on the REGs information and the coil element sensitivity maps; determining, for each REG, signals within a region of interest (ROI) and signals outside of the ROI based on the REG sensitivity maps; selecting one or more REGs based on the signals within the ROI and the signals outside of the ROI of each REG; and scanning the ROI with the coil elements in the selected REGs being activated and the coil elements not in any selected REGs being deactivated. In a first example of the method, scanning the ROI with the coil elements in the selected REGs being activated comprises scanning the ROI with the selected REGs being activated during a higher resolution scan, and wherein generating coil element sensitivity maps for the plurality of coil elements comprise generating coil element sensitivity maps for the plurality of coil elements based on data acquired from a lower resolution calibration scan. A second example of the method optionally includes the first example and further includes wherein generating the plurality of coil element sensitivity maps comprises, for each coil element, projecting a 3D dataset acquired with that coil element during the lower resolution calibration scan along a coil selection direction. A third example of the method optionally includes one or more of the first and second examples, and further includes, wherein generating the REG sensitivity maps based on the REGs information and the coil element sensitivity maps comprises, for each REG, combining each coil element sensitivity map associated with that REG as defined by the REGs information. A fourth example of the method optionally includes one or more of the first through third examples, and further includes, wherein selecting one or more REGs based on the signals within the ROI and the signals outside of the ROI of each REG comprises: obtaining a phase wrap penalty curve; determining a net signal for each REG based on respective signals within the ROI, respective signals outside of the ROI, and the phase wrap penalty curve; and selecting one or more REGs based on the REG sensitivity maps, the ROI, and each net signal. A fifth example of the method optionally includes one or more of the first through fourth examples, and further includes, wherein selecting one or more REGs based on the REG sensitivity maps, the ROI, and the net signal comprises: determining if each net signal is greater than a first threshold; and if at least one REG has a net signal that is greater than the first threshold, selecting each REG that has a net signal greater than the first threshold as the one or more selected REGs. A sixth example of the method optionally includes one or more of the first through fifth examples, and further includes, if no REGs have a net signal that is greater than the first threshold, determining a total signal within the ROI of each REG by summing REG sensitivity values of a respective REG within the ROI, and determining if at least one REG has a total signal within the ROI that is greater than a second threshold; if at least one REG has a total signal within the ROI that is greater than the second threshold, selecting the REG that has the highest total signal within the ROI as the one or more selected REGs; and if no REGs have a total signal within the ROI that is greater than the second threshold, outputting a notification to an operator to reposition the RF coil array and/or reposition an imaging subject.

In another embodiment, a method for magnetic resonance imaging (MRI) with a radio frequency (RF) coil array comprising a plurality of coil elements includes, obtaining a plurality of datasets, each dataset representing a sensitivity of a respective coil element of the plurality of coil elements of the RF coil array during a lower resolution calibration scan of a field of view (FOV), the plurality of coil elements grouped into a plurality of receive element groups (REGs); determining a first sensitivity of one or more REGs to magnetic resonance (MR) signals generated within a region of interest (ROI) based on the plurality of datasets; determining a second sensitivity of the one or more REGS to MR signals generated outside the ROI based on the plurality of datasets; obtaining a penalty parameter representing a significance of a phase wrap artifact along a coil selection direction; selecting one or more REGs based on the first sensitivity, the second sensitivity, and the penalty parameter; and reconstructing an image covering the ROI based on data obtained from the selected one or more REGs during a higher resolution main scan. In a first example of the method, the method further includes, projecting each dataset of the plurality of datasets onto a coil selection direction to generate a plurality of coil element sensitivity maps, and combining the plurality of coil element sensitivity maps based on REGs information to generate a plurality of REG sensitivity maps each representing a sensitivity of a respective REG. A second example of the method optionally includes the first example and further includes, wherein determining the first sensitivity of the one or more REGs comprises, for each REG, summing each REG sensitivity value of the REG sensitivity map within the ROI for that REG. A third example of the method optionally includes one or more of the first and second examples, and further includes, wherein determining the second sensitivity of the one or more REGs comprises, for each REG, summing each REG sensitivity value of the REG sensitivity map outside the ROI for that REG. A fourth example of the method optionally includes one or more of the first through third examples, and further includes, wherein selecting one or more REGs based on the first sensitivity and the second sensitivity comprises selecting each REG based on a difference between the first sensitivity and the second sensitivity weighted by the penalty parameter.

In another embodiment, a magnetic resonance imaging (MRI) apparatus includes, a controller unit; a radiofrequency (RF) coil array including a plurality of coil elements, the coil elements grouped into a plurality of receive element groups (REGs), each REG comprising a subset of the plurality of the coil elements; a memory storing executable instructions that when executed cause the controller unit to: select a receive element group (REG) from the plurality of REGs based on a first sensitivity of the REG to magnetic resonance (MR) signals generated outside a region of interest (ROI), a second sensitivity of the REG to magnetic resonance (MR) signals generated inside the ROI, and a phase wrap parameter; and scan the ROI with the selected REG being active and any non-selected REGs of the plurality of REGs being deactivated. In a first example of the apparatus, the phase wrap parameter defines a contribution of a sensitivity extent of the REG to a phase wrap artifact as a function of distance from the ROI along a coil selection direction. A second example of the apparatus optionally includes the first example and further includes, wherein the coil selection direction is a phase-encoding direction of the MRI apparatus. A third example of the apparatus optionally includes one or more of the first and second examples, and further includes, wherein the scan of the ROI with the selected REG being active is a higher resolution main scan, and wherein the instructions are executable to determine the first sensitivity and the second sensitivity based on data acquired from at least a subset of the plurality of the coil elements during a lower resolution calibration scan performed prior to the higher resolution main scan. A fourth example of the apparatus optionally includes one or more of the first through third examples, and further includes, wherein the instructions are executable to: determine a coil element sensitivity of each coil element of the at least the subset of the plurality of the coil elements based on the data acquired during the lower resolution calibration scan; determine a REG sensitivity for the REG by combining coil element sensitivities of each coil element of the plurality of the coil elements corresponding to the REG, the REG sensitivity comprising a sensitivity of the REG along the coil selection direction; and determine the first sensitivity of the REG to the MR signals generated outside of the ROI based on each REG sensitivity of the REG along the coil selection direction outside the ROI. A fifth example of the apparatus optionally includes one or more of the first through fourth examples, and further includes, wherein the instructions are executable to determine the second sensitivity of the REG to the MR signals generated inside of the ROI based on each REG sensitivity of the REG along the coil selection direction inside the ROI. A sixth example of the apparatus optionally includes one or more of the first through fifth examples, and further includes, wherein the instructions are executable to determine a net sensitivity of the REG by determining a difference between a sum of the second sensitivity and a dot product of the first sensitivity and the phase wrap parameter, and select the REG responsive to the net sensitivity of the REG being greater than a threshold sensitivity. A seventh example of the apparatus optionally includes one or more of the first through sixth examples, and further includes, wherein the instructions are executable to determine a net sensitivity for each remaining REG of the RF coil array, and if a remaining REG has a net sensitivity that is not greater than the threshold sensitivity, not select the remaining REG for the scanning of the ROI.

In another representation, a method for magnetic resonance imaging (MRI) with a radio frequency (RF) coil array comprising a plurality of coil elements includes, selecting a receive element group (REG) from a plurality of REGs based on a sensitivity of the REG outside a region of interest (ROI) relative to a sensitivity of the REG inside the ROI; and reconstructing an image covering the ROI based on data obtained from the selected REG. In a first example of the method, the method further includes, determining sensitivity of each REG outside ROI and a sensitivity of each REG inside ROI; selecting each REG that has a higher sensitivity inside ROI than the sensitivity outside ROI weighted by a penalty parameter; and not selecting each REG that has a lower sensitivity inside ROI than the sensitivity outside ROI weighted by the penalty parameter. A second example of the method optionally includes the first example and further includes, wherein not selecting the REG includes turning off non-selected REGs during scanning, and scanning with the selected REG. A second example of the method optionally includes the first example and further includes, wherein the sensitivity outside ROI weighted by the penalty parameter is determined as a sum of each data point of the REG sensitivity outside the ROI weighted by a corresponding value of the penalty parameter.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for magnetic resonance imaging (MRI) with a radio frequency (RF) coil array comprising a plurality of coil elements, the method comprising:
grouping the plurality of coil elements into receive elements groups (REGs) according to REGs information;
generating a coil element sensitivity map for each coil element of the plurality of coil elements based on data acquired from a lower resolution calibration scan, including, for each coil element, projecting a 3D dataset acquired with that coil element during the lower resolution calibration scan along a coil selection direction;
generating REG sensitivity maps based on the REGs information and the coil element sensitivity maps;
determining, for each REG, signals within a region of interest (ROI) based on the REG sensitivity maps to generate an ROI parameter for each REG;
determining, for each REG, signals outside of the ROI based on the REG sensitivity maps to generate a non-ROI parameter for each REG;
selecting one or more REGs based on the each ROI parameter for each REG and each non-ROI parameter for each REG;
upon selecting the one or more REGs, scanning the ROI with the coil elements in the selected REGs being activated and the coil elements not in any selected REGs being deactivated; and
reconstructing an image covering the ROI based on data obtained from the selected REGs during the scanning.

2. The method of claim 1, wherein scanning the ROI with the coil elements in the selected REGs being activated comprises scanning the ROI with the selected REGs being activated during a higher resolution scan.

3. The method of claim 1, wherein generating the REG sensitivity maps based on the REGs information and the coil element sensitivity maps comprises, for each REG, combining each coil element sensitivity map associated with that REG as defined by the REGs information.

4. The method of claim 1, wherein selecting one or more REGs based on each ROI parameter and each non-ROI parameter comprises:
obtaining a phase wrap penalty curve;
determining a respective net signal for each REG based on a respective ROI parameter, a respective non-ROI parameter, and the phase wrap penalty curve; and
selecting one or more REGs based on the REG sensitivity maps, the ROI, and each net signal.

5. The method of claim 4, wherein selecting one or more REGs based on the REG sensitivity maps, the ROI, and the net signal comprises:
determining if each net signal is greater than a first threshold; and
if at least one REG has a net signal that is greater than the first threshold, selecting each REG that has a net signal greater than the first threshold as the one or more selected REGs.

6. The method of claim 5, further comprising if no REGs have a net signal that is greater than the first threshold, determining a total signal within the ROI of each REG by summing REG sensitivity values of a respective REG within the ROI, and determining if at least one REG has a total signal within the ROI that is greater than a second threshold;
if at least one REG has a total signal within the ROI that is greater than the second threshold, selecting the REG that has the highest total signal within the ROI as the one or more selected REGs; and
if no REGs have a total signal within the ROI that is greater than the second threshold, outputting a notification to an operator to reposition the RF coil array and/or reposition an imaging subject.

7. A method for magnetic resonance imaging (MRI) with a receive radio frequency (RF) coil array, the RF coil array comprising a plurality of coil elements, the method comprising:
obtaining a plurality of datasets, each dataset representing a sensitivity of a respective coil element of the plurality of coil elements of the RF coil array during a lower resolution calibration scan of a field of view (FOV), the plurality of coil elements grouped into a plurality of receive element groups (REGs);

determining a first sensitivity of one or more REGs to magnetic resonance (MR) signals generated within a region of interest (ROI) based on the plurality of datasets;

determining a second sensitivity of the one or more REGS to MR signals generated outside the ROI based on the plurality of datasets;

obtaining a penalty parameter representing a significance of a phase wrap artifact along a coil selection direction;

selecting one or more REGs based on the first sensitivity, the second sensitivity, and the penalty parameter;

upon selecting the one or more REGs, performing a higher resolution main scan of the ROI with the coil elements in the selected one or more REGs being activated and the coil elements not in any selected REGs being deactivated; and reconstructing an image covering the ROI based on data obtained from the higher resolution main scan.

8. The method of claim 7, further comprising projecting each dataset of the plurality of datasets onto a coil selection direction to generate a plurality of coil element sensitivity maps, and combining the plurality of coil element sensitivity maps based on REGs information to generate a plurality of REG sensitivity maps each representing a sensitivity of a respective REG.

9. The method of claim 8, wherein determining the first sensitivity of the one or more REGs comprises, for each REG, summing each REG sensitivity value of the REG sensitivity map within the ROI for that REG.

10. The method of claim 8, wherein determining the second sensitivity of the one or more REGs comprises, for each REG, summing each REG sensitivity value of the REG sensitivity map outside the ROI for that REG.

11. The method of claim 7, wherein selecting one or more REGs based on the first sensitivity and the second sensitivity comprises selecting each REG based on a difference between the first sensitivity and the second sensitivity weighted by the penalty parameter.

12. A magnetic resonance imaging (MRI) apparatus, comprising:
a controller unit;
a radiofrequency (RF) coil array including a plurality of coil elements, the coil elements grouped into a plurality of receive element groups (REGs), each REG comprising a subset of the plurality of the coil elements;
a memory storing executable instructions that when executed cause the controller unit to:
select a receive element group (REG) from the plurality of REGs based on a first sensitivity of the REG to magnetic resonance (MR) signals generated outside a region of interest (ROI), a second sensitivity of the REG to magnetic resonance (MR) signals generated inside the ROI, and a phase wrap parameter; and
upon selecting the REG, scan the ROI with the selected REG being active and any non-selected REGs of the plurality of REGs being deactivated.

13. The MRI apparatus of claim 12, wherein the phase wrap parameter defines a contribution of a sensitivity extent of the REG to a phase wrap artifact as a function of distance from the ROI along a coil selection direction.

14. The MRI apparatus of claim 13, wherein the coil selection direction is a phase-encoding direction of the MRI apparatus.

15. The MRI apparatus of claim 13, wherein the scan of the ROI with the selected REG being active is a higher resolution main scan, and wherein the instructions are executable to determine the first sensitivity and the second sensitivity based on data acquired from at least a subset of the plurality of the coil elements during a lower resolution calibration scan performed prior to the higher resolution main scan.

16. The MRI apparatus of claim 15, wherein the instructions are executable to:
determine a coil element sensitivity of each coil element of the at least the subset of the plurality of the coil elements based on the data acquired during the lower resolution calibration scan;
determine a REG sensitivity for the REG by combining coil element sensitivities of each coil element of the plurality of the coil elements corresponding to the REG, the REG sensitivity comprising a sensitivity of the REG along the coil selection direction; and
determine the first sensitivity of the REG to the MR signals generated outside of the ROI based on each REG sensitivity of the REG along the coil selection direction outside the ROI.

17. The MRI apparatus of claim 16, wherein the instructions are executable to determine the second sensitivity of the REG to the MR signals generated inside of the ROI based on each REG sensitivity of the REG along the coil selection direction inside the ROI.

18. The MRI apparatus of claim 17, wherein the instructions are executable to determine a net sensitivity of the REG by determining a difference between a sum of the second sensitivity and a dot product of the first sensitivity and the phase wrap parameter, and select the REG responsive to the net sensitivity of the REG being greater than a threshold sensitivity.

19. The MRI apparatus of claim 18, wherein the instructions are executable to determine a net sensitivity for each remaining REG of the RF coil array, and if a remaining REG has a net sensitivity that is not greater than the threshold sensitivity, not select the remaining REG for the scanning of the ROI.

* * * * *